(12) United States Patent
Yoshioka et al.

(10) Patent No.: US 8,901,728 B2
(45) Date of Patent: *Dec. 2, 2014

(54) METHOD OF MOUNTING SEMICONDUCTOR CHIPS, SEMICONDUCTOR DEVICE OBTAINED USING THE METHOD, METHOD OF CONNECTING SEMICONDUCTOR CHIPS, THREE-DIMENSIONAL STRUCTURE IN WHICH WIRING IS PROVIDED ON ITS SURFACE, AND METHOD OF PRODUCING THE SAME

(71) Applicant: Panasonic Corporation, Osaka (JP)

(72) Inventors: Shingo Yoshioka, Osaka (JP); Hiroaki Fujiwara, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/096,504

(22) Filed: Dec. 4, 2013

(65) Prior Publication Data

US 2014/0090876 A1    Apr. 3, 2014

Related U.S. Application Data

(60) Continuation of application No. 13/836,706, filed on Mar. 15, 2013, which is a division of application No. 13/144,112, filed as application No. PCT/JP2010/050971 on Jan. 26, 2010, now Pat. No. 8,482,137.

(30) Foreign Application Priority Data

Jan. 27, 2009  (JP) .................................. 2009-015052
Nov. 4, 2009   (JP) .................................. 2009-253131

(51) Int. Cl.
   *H01L 23/48* (2006.01)
   *H01L 23/04* (2006.01)
   (Continued)

(52) U.S. Cl.
   CPC ......... *H05K 1/11* (2013.01); *H01L 24/24* (2013.01); *H01L 24/25* (2013.01); *H01L 24/82* (2013.01);
   (Continued)

(58) Field of Classification Search
   USPC ................. 257/690, 730, 773, 775, 776, 784, 257/E23.02
   See application file for complete search history.

(56) References Cited

U.S. PATENT DOCUMENTS

5,455,455 A    10/1995  Badehi
5,547,906 A     8/1996  Badehi
(Continued)

FOREIGN PATENT DOCUMENTS

EP    0260514    3/1988
EP    1326289    7/2003
(Continued)

OTHER PUBLICATIONS

China Office action, mail date is Feb. 5, 2013, with a partial English translation thereof (a portion regarding KR10-0577443).
(Continued)

*Primary Examiner* — Jasmine Clark
(74) *Attorney, Agent, or Firm* — Greenblum & Bernstein, P.L.C.

(57) ABSTRACT

A three-dimensional structure in which a wiring and a pad part are provided on a surface is provided. A recessed gutter for wiring and a hole for the pad part having a depth that is greater than a thickness of the recessed gutter for wiring are provided on the surface of the three-dimensional structure. The hole for the pad part is provided in succession with the recessed gutter for wiring. At least a part of a wiring conductor is embedded in the recessed gutter for wiring and in the hole for the pad part.

4 Claims, 21 Drawing Sheets

(51) Int. Cl.
| | |
|---|---|
| H05K 1/11 | (2006.01) |
| H01L 23/00 | (2006.01) |
| H01L 25/065 | (2006.01) |
| H01L 25/00 | (2006.01) |
| G11B 5/48 | (2006.01) |
| H05K 1/18 | (2006.01) |
| H05K 3/18 | (2006.01) |
| H01L 21/66 | (2006.01) |
| H01L 23/31 | (2006.01) |
| H01L 21/56 | (2006.01) |

(52) U.S. Cl.
CPC ........ *H01L 25/0655* (2013.01); *H01L 25/0657* (2013.01); *H01L 25/50* (2013.01); *H01L 24/03* (2013.01); *H01L 24/05* (2013.01); *G11B 5/486* (2013.01); *H05K 1/111* (2013.01); *H05K 1/181* (2013.01); *H05K 3/184* (2013.01); *H05K 1/117* (2013.01); *H01L 22/12* (2013.01); *H01L 23/3121* (2013.01); *H01L 2224/16227* (2013.01); *H01L 2224/16237* (2013.01); *H01L 2224/24051* (2013.01); *H01L 2224/24137* (2013.01); *H01L 2224/24226* (2013.01); *H01L 2224/25175* (2013.01); *H01L 2224/48091* (2013.01); *H01L 2224/48227* (2013.01); *H01L 2224/85* (2013.01); *H01L 2225/06524* (2013.01); *H01L 2225/06551* (2013.01); *H01L 2225/06565* (2013.01); *H01L 2924/01004* (2013.01); *H01L 2924/01005* (2013.01); *H01L 2924/01011* (2013.01); *H01L 2924/01012* (2013.01); *H01L 2924/01013* (2013.01); *H01L 2924/01015* (2013.01); *H01L 2924/0102* (2013.01); *H01L 2924/01027* (2013.01); *H01L 2924/01029* (2013.01); *H01L 2924/0103* (2013.01); *H01L 2924/01033* (2013.01); *H01L 2924/01046* (2013.01); *H01L 2924/01051* (2013.01); *H01L 2924/01056* (2013.01); *H01L 2924/01057* (2013.01); *H01L 2924/01058* (2013.01); *H01L 2924/01075* (2013.01); *H01L 2924/01078* (2013.01); *H01L 2924/01079* (2013.01); *H01L 2924/01082* (2013.01); *H01L 2924/09701* (2013.01); *H01L 2924/12044* (2013.01); *H01L 2924/14* (2013.01); *H01L 2924/19041* (2013.01); *H01L 2924/19043* (2013.01); *H01L 24/48* (2013.01); *H01L 2924/01006* (2013.01); *H01L 2924/01019* (2013.01); *H01L 2924/01023* (2013.01); *H01L 2924/01042* (2013.01); *H01L 2924/01047* (2013.01); *H01L 2924/014* (2013.01); *H01L 2924/01014* (2013.01); *H01L 2924/01028* (2013.01); *H01L 2224/24146* (2013.01); *H01L 24/83* (2013.01); *H01L 2224/24011* (2013.01); *H01L 2224/2405* (2013.01); *H01L 2224/245* (2013.01); *H01L 2224/32225* (2013.01); *H01L 2224/82039* (2013.01); *H01L 2224/82101* (2013.01); *H01L 2224/82931* (2013.01); *H01L 2224/82947* (2013.01); *H01L 2224/8385* (2013.01); *H01L 2224/92244* (2013.01); *H01L 2224/82009* (2013.01); *H05K 2201/0376* (2013.01); *H05K 2201/09472* (2013.01); *H01L 2924/00015* (2013.01); *H01L 21/565* (2013.01); *H01L 2924/10253* (2013.01); *H01L 2924/12041* (2013.01); *H01L 2224/16225* (2013.01)
USPC .......... 257/690; 257/730; 257/773; 257/776; 257/784; 257/E23.02

(56) References Cited

U.S. PATENT DOCUMENTS

| | | | |
|---|---|---|---|
| 6,233,818 B1 * | 5/2001 | Finn et al. | ........................ 29/843 |
| 6,518,090 B2 | 2/2003 | Dotta et al. | |
| 6,521,997 B1 | 2/2003 | Huang et al. | |
| 6,528,894 B1 | 3/2003 | Akram et al. | |
| 6,774,499 B1 | 8/2004 | Yang | |
| 7,015,128 B1 | 3/2006 | Chiang et al. | |
| 7,227,258 B2 | 6/2007 | Cho et al. | |
| 7,468,291 B2 | 12/2008 | Gui et al. | |
| 7,750,441 B2 | 7/2010 | Hsu et al. | |
| 8,138,617 B2 | 3/2012 | Poo et al. | |
| 8,482,137 B2 * | 7/2013 | Yoshioka et al. | ............ 257/784 |
| 2002/0005567 A1 | 1/2002 | Sakai et al. | |
| 2003/0006493 A1 | 1/2003 | Shimoishizaka et al. | |
| 2003/0024731 A1 | 2/2003 | Nordal et al. | |
| 2003/0170946 A1 | 9/2003 | Kondo | |
| 2003/0227080 A1 | 12/2003 | Goto | |
| 2004/0157410 A1 | 8/2004 | Yamaguchi | |
| 2005/0263860 A1 | 12/2005 | Hirano et al. | |
| 2011/0006381 A1 * | 1/2011 | Feiertag et al. | ............... 257/416 |
| 2011/0204513 A1 * | 8/2011 | Meyer et al. | .................. 257/738 |

FOREIGN PATENT DOCUMENTS

| | | |
|---|---|---|
| JP | 61-78132 | 4/1986 |
| JP | 4-350951 | 12/1992 |
| JP | 7-86340 | 3/1995 |
| JP | 7-281437 | 10/1995 |
| JP | 8-503813 | 4/1996 |
| JP | 2772157 | 7/1998 |
| JP | 11-212262 | 8/1999 |
| JP | 2000-231190 | 8/2000 |
| JP | 2001-201851 | 7/2001 |
| JP | 2002-076167 | 3/2002 |
| JP | 2002-299341 | 10/2002 |
| JP | 2004-015017 | 1/2004 |
| JP | 2005-032894 | 2/2005 |
| JP | 2006-013465 | 1/2006 |
| JP | 2007-88288 | 4/2007 |
| JP | 2008-118075 | 5/2008 |
| JP | 2008-251948 | 10/2008 |
| KR | 10-0577443 | 4/2006 |

OTHER PUBLICATIONS

Koyanagi, Mitsumasa et al., "Reference handout of MEMS-Semiconductor Lateral Wiring Technique", Co-Hosted Program of 19th Micromachine/MEMS Exhibition of Fine MEMS Project Interim Result Presentation, Jul. 31, 2008, pp. 1-17 (and partial translation thereof).

Search report from E.P.O., mail date is Nov. 5, 2013.

* cited by examiner

METHOD OF MOUNTING SEMICONDUCTOR CHIPS, SEMICONDUCTOR DEVICE OBTAINED USING THE METHOD, METHOD OF CONNECTING SEMICONDUCTOR CHIPS, THREE-DIMENSIONAL STRUCTURE IN WHICH WIRING IS PROVIDED ON ITS SURFACE, AND METHOD OF PRODUCING THE SAME

CROSS REFERENCE TO RELATED APPLICATIONS

This application is continuation application of U.S. patent application Ser. No. 13/836,706, which is a divisional application of U.S. patent application Ser. No. 13/144,112, filed Jul. 12, 2011, now U.S. Pat. No. 8,482,137, issued Jul. 9, 2013, which is a U.S. National Stage Application of International Application No. PCT/JP2010/050971, filed Jan. 26, 2010, the disclosures of which are expressly incorporated by reference herein. The International Application was not published under PCT Article 21(2) in English.

This application claims priority of Japanese Patent Application Nos. 2009-253131, filed Nov. 4, 2009 and 2009-015052, filed Jan. 27, 2009, the disclosures of which are expressly incorporated by reference herein.

TECHNICAL FIELD

The present invention relates to a method of mounting a semiconductor chip on an insulating base material surface, a semiconductor device obtained by using the foregoing method, a method of connecting a plurality of semiconductor chips disposed on an insulating base material surface, a three-dimensional structure such as a semiconductor device in which a wiring is provided on its surface, and a method of producing such as a three-dimensional structure.

BACKGROUND ART

Conventionally, a semiconductor device in which a semiconductor chip is mounted on an insulating base material is well known. As the method of mounting a semiconductor chip on an insulating base material and electrically connecting the semiconductor chip to an electrode pad formed on the insulating base material surface, the wire bonding method is widely used.

The wire connection method based on wire bonding is a method, as shown in FIG. 6, of mutually connecting a bonding pad 22a formed on an upper surface of a semiconductor chip 22 and an electrode pad 11a on the side of an insulating base material 11 via a wire 13 formed from gold, copper or the like and having a diameter of several 10 μm. More specifically, this is a method of connecting a wire protruding from the tip of a capillary through a through-hole formed at the center of a movable capillary to one pad with the ultrasonic combination thermocompression bonding method, and thereafter moving the capillary to the other pad while pulling the wire out from the through hole, and connecting the wire to the pad with the ultrasonic combination thermocompression bonding method while pressing the wire and the capillary against the other pad, and simultaneously breaking the wire.

According to the wire bonding method, as shown in FIG. 6, the bonding pad 22a formed on the surface of the semiconductor chip 22 and the electrode pad 11a on the surface of the insulating base material 11 are mutually wire-connected with the wire having a diameter of roughly several 10 μm. This kind of method entails the following problems.

Under normal circumstances, in the production process of a semiconductor device, after the wire bonding process, the surface of the semiconductor chip is sealed with a seal material in order to protect the semiconductor chip, and then packaged. The seal material that is used in the foregoing sealing step usually contains large amounts of inorganic filling material so as to provide sufficient insulation or to increase the dimensional stability. Thus, the seal material containing large amounts of inorganic filling material as described above has extremely inferior fluidity. Consequently, after inserting a base material mounted with a semiconductor chip into a mold and thereafter filling the seal material inside the mold, it is necessary to perform the molding at an extremely high pressure. In such case, considerably external force is applied to the wire used for the bonding, and there was a problem in that the reliability of the semiconductor device would be impaired due to the breakage or damage of the wire. In order to resolve this kind of problem, measures of increasing the wire diameter are also being adopted. Nevertheless, expensive gold is often used as the wire. Thus, increasing the wire diameter means increased costs. In addition, with the wire bonding method, since the wire spacing cannot be narrowed in consideration of the sweep amount of the wire, there is a problem in that the wiring density is low.

As an alternative method to the wire bonding, for example, the method described in following Non-Patent Document 1 is known. The outline is specifically explained. (1) Foremost, a semiconductor chip that is fixed on a flexible substrate is coated with a silicon oxide film. Subsequently, an organic film for flattening the silicon oxide film surface is formed. Subsequently, a metal mask is used to remove the silicon oxide film on the surface of the bonding pad of the semiconductor chip surface and the surface of the electrode pad formed on the flexible substrate, and the organic film. (2) Subsequently, only the organic film of the other portions is removed. (3) Subsequently, plating seeds are attached to the entire surface, and a resist for plating is additionally formed so as to cover the plating seeds. Subsequently, a silicon oxide film is additionally formed on the surface of the resist for plating. Subsequently, an organic film for flattening the silicon oxide film surface is formed once again. (4) Subsequently, a metal mask is used to remove the silicon oxide film and the organic film along a path of the portion connecting the bonding pad and the electrode pad where the wiring should be formed. (5) Subsequently, with the silicon oxide film as the mask, the plating seeds are exposed by removing the resist for plating of the portions where the silicon oxide film is not formed. (6) Finally, by performing plating processing, plating is formed only at the portion where the plating seeds remain based on the foregoing steps, and a wiring is thereby formed.

Non-Patent Document 1: Reference handout of MEMS-Semiconductor Lateral Wiring Technique (Lecture of Mr. Mitsumasa Koyanagi, Professor of Tohoku University, Graduate School of Engineering) in Co-Hosted Program of 19th Micromachine/MEMS Exhibition of Fine MEMS Project Interim Result Presentation (Jul. 31, 2008 at Tokyo Big Site)

SUMMARY OF THE INVENTION

The present invention aims to resolve the foregoing problems in the wiring bonding that was conventionally used for connecting the semiconductor chip disposed on the insulating base material surface to the electrode pad formed on the insulating base material surface, and its object is to form, with an easy process, a wiring capable of inhibiting the breakage or damage of the wire during the sealing performed with the resin seal material.

Moreover, another object of this invention is to improve the adhesive strength of the wiring relative to a three-dimensional structure in which a wiring is provided on its structure, and consequently reduce problems such as the falling, dislocation and disconnection of the wiring.

One aspect of the present invention is a method of mounting a semiconductor chip for electrically connecting a bonding pad, which is provided on a surface of a semiconductor chip disposed on an insulating base material surface, to an electrode pad corresponding to the bonding pad formed on the insulating base material surface, the method comprising: a coating forming step of forming a resin coating on a surface of a path connecting the bonding pad and the electrode pad; a wiring gutter forming step of forming, by laser beam machining, a wiring gutter having a depth that is equal to or greater than a thickness of the resin coating along the path for connecting the bonding pad and the electrode pad; a catalyst depositing step of depositing a plating catalyst or a precursor thereof on a surface of the wiring gutter; a coating removing step of removing the resin coating by causing this coating to dissolve or swell in a predetermined liquid; and a plating processing step of forming, after the resin coating is removed, an electroless plating coating only at a site where the plating catalyst or a plating catalyst formed from the plating catalyst precursor remains.

Another aspect of the present invention is a three-dimensional structure in which a wiring is formed on a surface, wherein, on the surface of the three-dimensional structure, a recessed gutter for wiring is formed, extending between mutually intersecting adjacent faces or on a planar surface or a curved surface of the three-dimensional structure, and wherein at least a part of a wiring conductor is embedded in the recessed gutter for wiring.

The objects, aspects, features and advantages of the present invention will become more evident based on the ensuing detailed explanation and the appended drawings.

DESCRIPTION OF THE PREFERRED EMBODIMENTS

According to studies conducted by the present inventors, a wiring for connecting the electrode pad of the substrate surface and the bonding pad of the chip surface can be formed without using wire bonding based on the method described in Non-Patent Document 1. Nevertheless, this kind of method is unsuitable for mass production since complex, multiple processes are required. The present invention was devised based on the results of the foregoing studies. The embodiments for implementing this invention are now explained in detail.

First Embodiment

The preferred embodiments of the method of mounting a semiconductor chip according to the present invention are now explained with reference to the drawings.

FIG. 1 and FIG. 2 are schematic diagrams explaining the respective processes in the method of mounting a semiconductor chip of this embodiment. Note that, in FIG. 1 and FIG. 2, 1 represents an insulating base material, 1a represents an electrode pad, 2 represents a semiconductor chip, 2a represents a bonding pad, 3 represents a resin coating, 4 represents a wiring gutter, 5 represents a plating catalyst, 6 represents an electroless plating coating, and 7 represents a wiring.

Figure 1A:
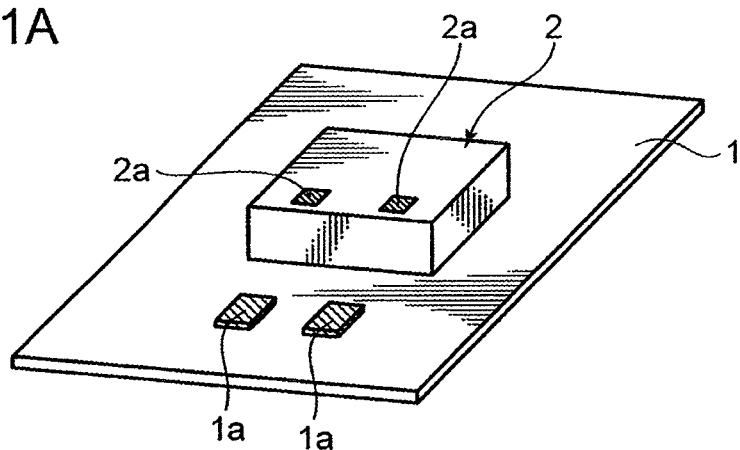
FIG. 1A to FIG. 1C are diagrams explaining the first half of the processes in the method of mounting a semiconductor chip according to the first embodiment of the present invention.

In the production method of this embodiment, as shown in FIG. 1A, foremost, an insulating base material 1 mounted with a semiconductor chip 2 in a predetermined chip mounting area is prepared.

Note that the semiconductor chip 2 is fixed to the predetermined chip mounting area on the surface of the insulating base material 1 using an adhesive or the like, and the adhesive surface is filled with resin so that no gaps will remain. Note that, as will be clarified later, in order to prevent the wiring 7 made of an electroless plating coating 6 from becoming directly formed on the silicon wafer (especially its side face that was subject to dicing) of the semiconductor chip 2, for example, it would be more preferable to at least preliminarily cover the part of the semiconductor chip 2 where the wiring 7 will be formed with an insulating organic material such as resin or an insulating organic material such as ceramics as represented by silica ($SiO_2$).

There is no particular limitation in the semiconductor chip, and an IC (Integrated Circuit), an LSI (Large Scale Integration), a VLSI (Very Large Scale Integration), or a light-emitting semiconductor chip such as an LED chip may be used.

Figure 1B:
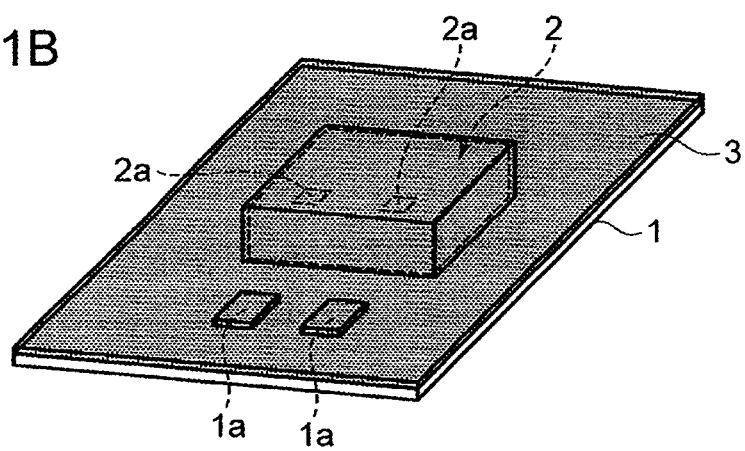

Subsequently, as shown in FIG. 1B, a resin coating 3 is formed on the surface of the semiconductor chip 2 and the insulating base material 1 (coating forming step).

As the insulating base material 1, various organic base materials and inorganic base materials that have been conventionally used for mounting a semiconductor chip can be used without particular limitation. As specific examples of the organic base material, base materials made of epoxy resin, acrylic resin, polycarbonate resin, polyimide resin, polyphenylene sulfide resin and the like can be used. The mode of the base material may be a sheet, a film, a prepreg, a three-dimensionally shaped compact or the like, and there is no particular limitation. There is no particular limitation in the thickness of the insulating base material 1. In the case of a sheet, a film or a prepreg, for example, the thickness is 10 to 200 µm, and more preferably around 20 to 100 µm.

As the method of forming the resin coating 3, there is no particular limitation so as long as it is a method which at least forms the resin coating 3 on the surface of a path connecting the respective electrode pads 1a and the respective bonding pads 2a on the surface of the insulating base material 1 and the surface of the semiconductor chip 2. Specifically, for example, adopted may be a method of applying and subsequently drying a liquid material capable of forming the resin coating 3 on the entire surface where the semiconductor chip 2 of the insulating base material 1 is disposed as shown in FIG. 1B. Moreover, as a separate method, adopted may be a method of transferring the resin coating 3 that was formed on the support base material in advance to the surface of the insulating base material 1. There is no particular limitation on the method of applying a resin fluid. Specifically, the dipping method or the spray method may be used.

The thickness of the resin coating 3 is 10 µm or less and preferably 5 µm or less, and 0.1 µm or more and preferably 1 µm or more. If the thickness is too thick, the dimension accuracy tends to deteriorate upon partially removing the resin coating 3 with laser beam machining, and, if the thickness is too thin, the formation of a coating with a uniform film thickness tends to be difficult.

As the material for forming the resin coating 3, any resin material that can be removed by dissolving or swelling in the removal process described later can be used without particular limitation. Specifically, for example, resist resin that is used in the field of photoresist or resin with a high swelling level relative to a predetermined liquid and which can be peeled by swelling can be used.

As specific examples of the resist resin, there are, for example, photocurable epoxy resin, etching resist, polyester resin, and rhodine resin.

Moreover, as the swellable resin, preferably used is swellable resin having a swelling level relative to a predetermined liquid that is 50% or higher, or 100% or higher, or even 500% or higher. As specific examples of the foregoing resin, for example, diene elastomer such as styrene-butadiene copolymer, acrylic elastomer such as acrylic acid ester copolymer, and polyester elastomer which have been adjusted to an intended swelling level by adjusting the degree of cross-linkage or the degree of gelation can be used.

The resin coating 3 is additionally explained in further detail.

As the resin coating (resist) 3, there is no particular limitation so as long as it can be removed in the removal process described later. The resin coating 3 is preferably a resin coating that can be easily removed by being dissolved or peeled from the surface of the insulating base material 1 as a result of being dissolved or swelled with a predetermined liquid. Specifically, for example, a coating made of soluble resin that can be easily dissolved in an organic solvent or an alkaline solution or a coating made of swellable resin that can be swelled in a predetermined liquid (swelling liquid) can be used. Note that the swellable resin coating includes, in addition to a resin coating which substantially does not dissolve in a predetermined liquid but can be easily peeled from the surface of the insulating base material 1 based on swelling, a resin coating which swells in a predetermined liquid and additionally in which at least a part thereof dissolves, and can be easily peeled from the surface of the insulating base material 1 based on such swelling and dissolution, and a resin coating which dissolves in a predetermined liquid, and can be easily peeled from the surface of the insulating base material 1 based on such dissolution. As a result of using this kind of resin coating, the resin coating 3 can be easily and favorably removed from the surface of the insulating base material 1. If the resin coating is collapsed upon removing the resin coating 3, there is a problem in that the plating catalyst 5 that is deposited on the resin coating 3 will scatter, and the scattered plating catalyst will be re-deposited on the insulating base material 1 and form unneeded plating at such portion. In this embodiment, the foregoing problem can be prevented since the resin coating 3 can be easily and favorable removed from the surface of the insulating base material 1.

There is no particular limitation on the method of forming the resin coating 3. Specifically, for example, a method of applying and subsequently drying a liquid material capable of forming the resin coating 3 on the surface of the insulating base material 1, or a method of transferring, to the surface of the insulating base material 1, the resin coating formed by applying and subsequently drying the liquid material on the support base material can be used. Moreover, as another method, a method of laminating a resin film made of a preformed resin coating 3 on the surface of the insulating base material 1 can also be used. Note that there is no particular limitation in the method of applying the liquid material. Specifically, for example, the conventionally known spin coat method and bar coater method can be used.

As the material for forming the resin coating 3, any resin material that can be easily removed by dissolution or swelling from the surface of the insulating base material 1 by dissolving or swelling in a predetermined liquid can be used without particular limitation. Preferably used is resin having a swelling level relative to a predetermined liquid that is 50% or higher, or 100% or higher, or even 500% or higher. Note that, if the swelling level is too low, the peeling of the resin coating tends to be difficult.

The swelling level (SW) of the resin coating can be obtained from the formula of "swelling level $SW=\{(m(a)-m(b))\, m(b)\}\times 100(\%)$" based on the pre-swelling weight $m(b)$ and the post-swelling weight $m(a)$.

This kind of resin coating 3 can be easily formed based on a method of applying and subsequently drying a suspension or an emulsion of an elastomer on the surface of the insulating base material 1, or a method of transferring, to the surface of the insulating base material 1, the coating formed by applying and subsequently drying a suspension or an emulsion of an elastomer on the support base material.

As specific examples of the elastomer, diene elastomer such as styrene-butadiene copolymer, acrylic elastomer such as acrylic acid ester copolymer, and polyester elastomer may be used. According to this kind of elastomer, a resin coating of an intended swelling level can be easily formed by adjusting the degree of cross-linkage or degree of gelation of the elastomer resin particles dispersed as the suspension or the emulsion.

As this kind of resin coating 3, particularly, it is preferably a coating in which the swelling level changes depending on the pH of the swelling liquid. When this kind of coating is used, by causing the liquid condition in the catalyst depositing step described later and the liquid condition in the coating removing step described later to be different, the resin coating 3 can maintain high adhesiveness to the insulating base material 1 in the pH in the catalyst depositing step, and at the same time the resin coating 3 can be easily peeled and removed from the insulating base material 1 in the pH in the coating removing step.

More specifically, for example, if the catalyst depositing step described later comprises a step of performing treatment in an acidic-catalyzed metal colloid solution within a range of pH 1 to 3, and the coating removing step described later comprises a step of swelling the resin coating in an alkaline solution within a range of pH 12 to 14, the resin coating 3 has preferably a swelling level relative to the acidic-catalyzed metal colloid solution that is 60% or less and more preferably 40% or less, and has a swelling level relative to the alkaline solution that is 50% or higher, preferably 100% or higher, and more preferably 500% or higher.

As examples of this kind of resin coating 3, a sheet formed from an elastomer containing a predetermined amount of carboxyl group, a sheet obtained by hardening the entire surface of a photocurable alkaline development-type resist that is used for a dry film resist (hereinafter sometimes referred to as the "DFR") for the patterning of the printed wiring board, or a thermosettable or alkaline development-type sheet can be used.

As specific examples of an elastomer containing a carboxyl group, diene elastomer such as styrene-butadiene copolymer, acrylic elastomer such as acrylic acid ester copolymer, and polyester elastomer which contain a carboxyl group in the molecules as a result of containing a monomer unit having a carboxyl group as a copolymerization component may be used. According to this kind of elastomer, a resin coating with an intended alkali swelling level can be formed by adjusting the acid equivalent, degree of cross-linkage, degree of gelation or the like of an elastomer that is dispersed as a suspension or an emulsion. Moreover, it is possible to increase the swelling level relative to a predetermined liquid in the coating removing step, and easily form a resin coating that dissolved in the foregoing liquid. The carboxyl group in the elastomer has the function of swelling the resin coating in the alkali aqueous solution and peeling the resin coating 3 from the surface of the insulating base material 1. Moreover, the acid equivalent is the polymeric molecular weight per carboxyl group.

As the specific examples of a monomer unit having a carboxyl group, (meta) acrylic acid, fumaric acid, cinnamic acid, crotonic acid, itaconic acid, maleic anhydride and the like may be used.

As the content ratio of the carboxyl group in the elastomer having such a carboxyl group, it is 100 to 2000, and preferably 100 to 800 based on acid equivalent. If the acid equivalent is too small (if the number of carboxyl groups relatively too many), the compatibility with the solvent or other compositions will deteriorate, and the resistance against the pretreatment liquid of the electroless plating tends to deteriorate. Moreover, if the acid equivalent is too large (if the number of carboxyl groups is relatively too few), the peelability relative to the alkali aqueous solution tends to deteriorate.

Moreover, as the molecular weight of the elastomer, it is 10,000 to 1,000,000, preferably 20,000 to 500,000, and more preferably 20,000 to 60,000. If the molecular weight of the elastomer is too heavy, the peelability tends to deteriorate, and, if it is too light, it becomes difficult to maintain the uniformity of the thickness of the resin coating since the viscosity will deteriorate, and the resistance to the pretreatment liquid of the electroless plating also tends to deteriorate.

Moreover, as the DFR, for example, used may be a sheet of a photocurable resin composition including a photopolymerization initiator and uses, as its resin component, acrylic resin, epoxy resin, styrene resin, phenolic resin, urethane resin or the like containing a predetermined number of carboxyl groups. As specific examples of this kind of DFR, there are, for example, a sheet that is obtained by hardening the entire surface of the dry film of a photopolymerizable resin composition as described in Japanese Patent Application Laid-open No. 2000-231190, Japanese Patent Application Laid-open No. 2001-201851, and Japanese Patent Application Laid-open No. H11-212262, or the UFG series manufactured by Asahi Kasei Corporation that is commercially available as an alkaline development-type DFR.

In addition, as other examples of the resin coating 3, there are the resin containing carboxyl group and having rhodine as its main component (for example "NAZDAR229" manufactured by Yoshikawa Chemical), and the resin having phenol as its main component (for example "104F" manufactured by LEKTRACHEM).

The resin coating 3 can be easily formed by applying the suspension or emulsion of resin on the surface of the insulating base material 1 by using a conventionally known application means such as the spin coat method or the bar coater method, and subsequently drying the same, or by laminating the DFR formed on the support base material on the surface of the insulating base material 1 by using a vacuum laminator or the like, and thereafter hardening the entire surface.

Moreover, as the resin coating 3, for example, a resin coating having, as its main component, resin (carboxyl group-containing acrylic resin) made of acrylic resin containing a carboxyl group in which the acid equivalent is roughly 100 to 800 can also be preferably used.

Moreover, in addition to those described above, the following can also be preferably used as the resin coating 3. Specifically, the resist material to configure the resin coating 3 required that, for example, (1) it possesses high resistance to the liquid (plating core applying solution) into which the insulating base material 1 formed with the resin coating 3 is dipped in the catalyst depositing step described later, (2) the resin coating (resist) 3 can be easily removed in the coating removing step described later, for example, in the step of dipping the insulating base material 1 formed with the resin coating 3 in alkali, (3) it possesses high deposition properties, (4) a dry film (DFR) can be easily formed, and (5) it possesses high preservability. As the plating core applying solution, although described later, in the case of an acidic Pd—Sn colloid catalyst system, for example, they are all acidic (for example, pH 1 to 3) aqueous solutions. Moreover, in the case of an alkaline Pd ion catalyst system, the catalyst-providing activator is weak alkali (pH 8 to 12), and the remainder are acidic. Accordingly, as the resistance to the plating core applying solution, it is necessary to withstand pH 1 to 11, and preferably pH 1 to 12. Note that the term "to withstand" means that, when a sample deposited with the resist is dipped in a chemical, the swelling and dissolving the resist is sufficiently suppressed, and fulfills the role as the resist. Moreover, generally speaking, the dipping temperature is room temperature to 60° C., the dipping time is 1 to 10 minutes, and the resist film thickness is roughly 1 to 10 μm, but these are not limited thereto. As the chemical to be used for the alkali peeling in the coating removing step, as described later, for example, a NaOH aqueous solution or a sodium carbonate aqueous solution is generally used. Its pH is 11 to 14, and a resist film can be easily removed if the pH is 12 to 14, and this is desirable. Generally speaking, the dipping or spray treatment is performed under the following conditions; namely, the NaOH aqueous solution concentration is roughly 1 to 10%, the treatment temperature is room temperature to 50° C., and the treating time is 1 to 10 minutes, but these are not limited thereto. Deposition properties are also required for forming a resist on the insulting material. Uniform film formation without any eye holes and the like is required. Moreover, although a dry film is formed for the simplification of the production process and reduction of material loss, the film needs to have bend performance in order to ensure the handling properties. Moreover, a resist formed into a dry film is laminated on the insulating material with a laminator (roll, vacuum). The lamination temperature is room temperature to 160° C., and the pressure and time can be arbitrarily set. Accordingly, viscosity is demanded during lamination. Thus, the resist formed as a dry film is usually formed as a three-layer structure by being sandwiched with a carrier film and a cover film also for preventing the attachment of dust, but the configuration is not limited thereto. As the preservability, storage at room temperature is preferable, but storage in a refrigerator and a freezer is also required. It is necessary to prevent the composition of the dry film from separating or cracking due to deterioration in the bend performance during a low temperature.

From the foregoing perspective, as the resin coating 3, polymer resin that can be obtained by polymerizing (a) at least one or more types of monomers of carboxylic acid or acid anhydride having at least one polymerizable unsaturated group in the molecules, and (b) at least one or more types of monomers that can be polymerized with the monomer of (a) above, or a resin composition containing such polymer resin may be used. As conventional technology, some examples are Japanese Patent Application Laid-open No. H7-281437, Japanese Patent Application Laid-open No. 2000-231190, Japanese Patent Application Laid-open No. 2001-201851 and so on. As examples of the (a) monomer, (meta) acrylic acid, fumaric acid, cinnamic acid, crotonic acid, itaconic acid, maleic anhydride, half esterified maleic acid, butyl acrylate and the like may be used, and these may be used alone or in combination of two or more types. As examples of the (b) monomer, generally used is a monomer that is non-acidic and has (one) polymerizable unsaturated group in the molecules, but is not limited thereto. The (b) monomer is selected so as to retain the various characteristics such as resistance, flexibility of the hardened film and so on in the catalyst depositing step described later. Specifically, methyl (meta) acrylate, ethyl (meta) acrylate, iso-propyl (meta) acrylate, n-butyl (meta) acrylate, sec-butyl (meta) acrylate, tert-butyl (meta) acrylate, 2-hydroxylethyl (meta) acrylate, 2-hydroxylpropyl (meta) acrylate and the like may be used. Moreover, esters of vinyl alcohol such as vinyl acetate, (meta) acrylonitrile, styrene or a polymerizable styrene derivative and the like may also be used. Moreover, this can also be obtained based only on the polymerization of carboxylic acid or acid anhydride having one of the foregoing polymerizable unsaturated groups in the molecules. In addition, it is possible to select a monomer having a plurality of unsaturated groups as the monomer for use as the polymer so as to enable a three-dimensional cross-link. Moreover, a reactive functional group such as the epoxy group, hydroxyl group, amino group, amide group, or vinyl group may be introduced into the molecular frame.

If a carboxyl group is contained in the resin, the amount of such carboxyl group contained in the resin is 100 to 2000 and preferably 100 to 800 based on acid equivalent. If the acid equivalent is too low, compatibility with the solvent or other compositions will deteriorate and the plating pretreatment liquid resistance will deteriorate. If the acid equivalent is too high, the peelability will deteriorate. Moreover, the composition ratio of the (a) monomer is preferably 5 to 70 mass percent.

The resin composition has the polymer resin as the main resin (binder resin) as its essential component, and at least one type of oligomer, monomer, filler or other additives may be added thereto. The main resin is preferably linear-type polymer with thermoplastic property. There are also cases where the grafting and branching are performed in order to control the fluidity and crystallinity. The molecular weight is roughly 1,000 to 500,000 and preferably 5,000 to 50,000 based on weight-average molecular weight. If the weight-average molecular weight is small, the bend performance of the film and the plating core applying solution resistance (acid resistance) will deteriorate. Moreover, if the molecular weight large, the alkali peelability and lamination properties when forming a dry film will deteriorate. In addition, a cross-link may also be introduced for improving the plating core applying solution resistance, inhibiting the thermal deformation during laser beam machining, and controlling the fluidity.

As the monomer or oligomer, any monomer or oligomer may be used so as long as it has resistance to the plating core applying solution and can be easily removed with alkali. Moreover, the use as a plasticizing agent for providing viscosity in order to improve the lamination properties of the dry film (DFR) can be considered. In addition, the addition of a cross-linking agent for increasing the various resistances can also be considered. Specifically, methyl (meta) acrylate, ethyl (meta) acrylate, iso-propyl (meta) acrylate, n-butyl (meta) acrylate, sec-butyl (meta) acrylate, tert-butyl (meta) acrylate, 2-hydroxylethyl (meta) acrylate, 2-hydroxylpropyl (meta) acrylate and the like may be used. Moreover, esters of vinyl alcohol such as vinyl acetate, (meta) acrylonitrile, styrene or a polymerizable styrene derivative and the like may also be used. Moreover, this can also be obtained based only on the polymerization of carboxylic acid or acid anhydride having one of the foregoing polymerizable unsaturated groups in the molecules. In addition, a multifunctional unsaturated compound may also be added. It may be the foregoing monomer or an oligomer that was reacted with the monomer. In addition to the foregoing monomers, two or more types of photopolymerizable monomers can also be added. As examples of the monomer, there are 1,6-hexanediol di (meta) acrylate, 1,4-cyclohexanediol di (meta) acrylate, or polypropyleneglycol di (meta) acrylate, polyethylene glycol di (meta) acrylate, polyoxyalkylene glycol di (meta) acrylate such as polyoxyethylene polyoxypropylene glycol di (meta) acrylate, 2-di (p-hydroxyphenyl) propane di (meta) acrylate, glycerol tri (meta) acrylate, dipentaerythritol penta (meta) acrylate, trimethylolpropane polyglycidyl ether tri (meta) acrylate, bisphenol A diglycidyl ether tri (meta) acrylate, 2,2-bis(4-methacryloxy pentaethoxyphenyl) propane, multifunctional (meta) acrylate containing an urethane group, and the like. It may be the foregoing monomer or an oligomer that was reacted with the monomer.

Although there is no particular limitation in the filler, silica, aluminum hydroxide, magnesium hydroxide, calcium carbonate, clay, kaolin, titanium oxide, barium sulfate, alumina, zinc oxide, talc, mica, glass, potassium titanate, Wollastonite, magnesium sulfate, aluminum borate, organic filler and the like may be used. Moreover, since the preferred thickness of the resist is thin at 0.1 to 10 μm, the filler size is also preferably small. The filler preferably has a small average particle size with coarse grains removed therefrom, but the coarse grains can also be pulverized during dispersion or removed with filtering.

As other additives, photopolymerizable resin (photopolymerization initiator), polymerization inhibitor, coloring agent (dye, pigment, color-forming pigment), thermal polymerization initiator, cross-linking agents such as epoxy and urethane may also be used.

In the wiring gutter forming step explained next, since the resin coating 3 is subject to laser beam machining and the like, it is necessary to provide laser abrasion properties to the resist material. A laser beam machine is selected, for example, among a carbon dioxide laser, excimer laser, UV-YAG laser and the like. These laser beam machines respective have their own unique wavelength, and the productivity can be improved by selecting materials with high UV absorptance relative to the foregoing wavelengths. Among the above, the UV-YAG laser is suitable for microfabrication, and, since the laser wavelength is a third harmonic of 355 nm and a fourth harmonic of 266 nm, the resist material (material of the resin coating 3) desirably has a relatively high UV absorptance relative to these wavelengths. As the UV absorptance becomes higher, the processing of the resist (resin coating 3) can be finished cleanly, and the productivity can also be improved. However, without limitation to the above, there are cases where a resist material having a relatively low UV absorptance is selected. As the UV absorptance becomes lower, since the UV light passes through the resist (resin coating 3), the UV energy can be concentrated on the processing of the insulating base material 1 therebelow, and, for example, this yields particularly favorable results when the insulating base material 1 is a material that is difficult to process. Accordingly, the resist material is preferably designed based on the ease of laser beam machining of the resist (resin coating 3), ease of laser beam machining of the insulating base material 1, and their relationship and the like.

Figure 1C:
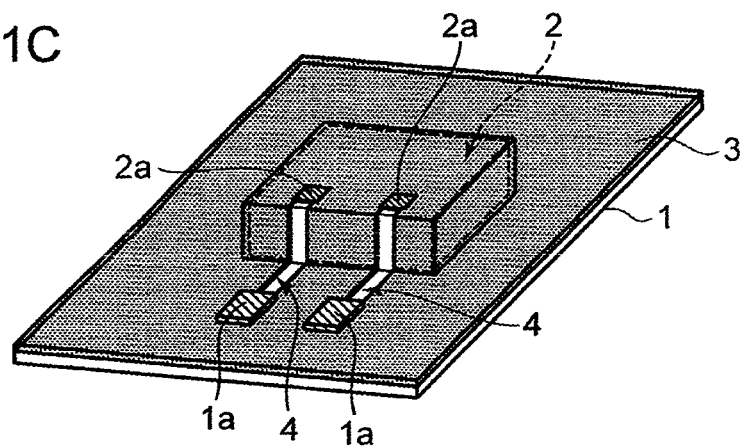

Subsequently, as shown in FIG. 1C, a wiring gutter 4 having a depth that is equal to or greater than the thickness of the formed resin coating 3 is formed (wiring gutter forming step). The wiring gutter 4 is formed by laser beam machining along a path connecting the respective bonding pads 2a on the surface of the semiconductor chip 2 and the respective electrode pads 1a formed on the surface of the insulating base material 1 to be connected to the respective bonding pads 2a.

The wiring gutter 4 is formed along the path for connecting the respective bonding pads 2a and the respective electrode pads 1a as described above. As a result of forming the wiring gutter 4 as described above, a wiring is formed as a result of the electroless plating coating 6 being formed only on the surface of the portion where the wiring gutter 4 was formed in the subsequent process.

Figure 2A:
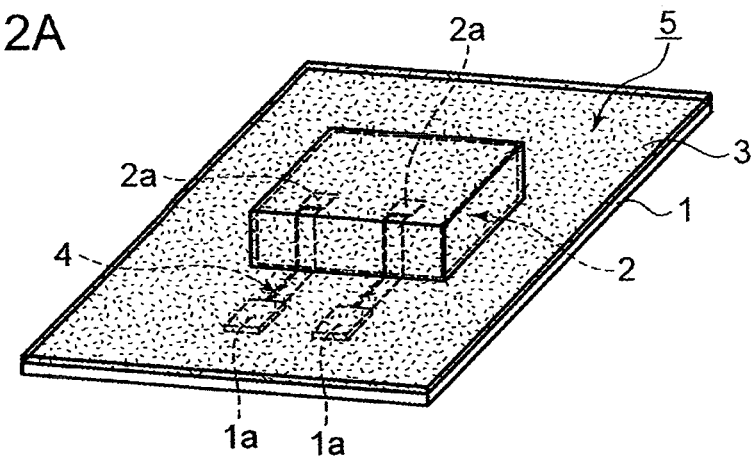
FIG. 2A to FIG. 2C are diagrams explaining the second half of the processes in the method of mounting a semiconductor chip according to the first embodiment of the present invention.

Subsequently, as shown in FIG. 2A, a plating catalyst 5 is deposited on the surface where the wiring gutter 4 was formed (catalyst depositing step).

The plating catalyst 5 is a catalyst that is provided for forming a plating film only at the portion where the electroless plating coating 6 should be formed in the plating processing step described later. As the plating catalyst, conventionally known catalysts for electroless plating can be used without any particular limitation. Moreover, it is also possible to deposit a precursor of the plating catalyst in advance and generate the plating catalyst after the removal of the resin coating 3. As specific examples of the plating catalyst, for example, metal palladium (Pd), platinum (Pt), silver (Ag) and the like, or a precursor and the like that can be generated therefrom can be used.

As the method of depositing the plating catalyst 5, for example, a method of treating in an acidic Pd—Sn colloid solution with the acidic conditions of pH 1 to 3, and thereafter treating in an acid solution can be used. More specifically, the following method can be used. Foremost, the oils and the like that adhered to the surface of the portion where the wiring gutter 4 was formed is dipped in a surfactant solution (cleaner conditioner) and washed with hot water. Subsequently, as needed, soft etching is performed with a sodium persulfate-sulfuric acid soft etching agent. Then, it is further pickled in an acidic solution such as a sulfuric acid aqueous solution or a hydrochloric acid aqueous solution of pH 1 to 2. Subsequently, after dipping this in a pre-dip liquid having a tin chloride aqueous solution or the like having a concentration of roughly 0.1% as its main component and adsorbing tin chloride, it is further dipped in an acidic-catalyzed metal colloid solution such as an acidic Pd—Sn colloid of pH 1 to 3 containing tin chloride and palladium chloride so as to flocculate and adsorb Pd and Sn. Subsequently, an oxidation-reduction reaction ($SnCl_2 + PdCl_2 \rightarrow SnCl_4 + Pd\downarrow$) is generated between the adsorbed tin chloride and palladium chloride. Metal palladium as the plating catalyst is thereby precipitated.

Note that, as the acidic-catalyzed metal colloid solution, a publicly known acidic Pd—Sn colloid catalyst solution and the like may be used, or a commercially available plating processing using an acidic-catalyzed metal colloid solution may be used. This kind of process, for example, is being systemized and sold by Rohm and Haas Electronic Materials.

Through this kind of catalyst deposit treatment, as shown in FIG. 2A, the plating catalyst 5 is deposited on the surface of the wiring gutter 4 and the surface of the resin coating 3.

Figure 2B:
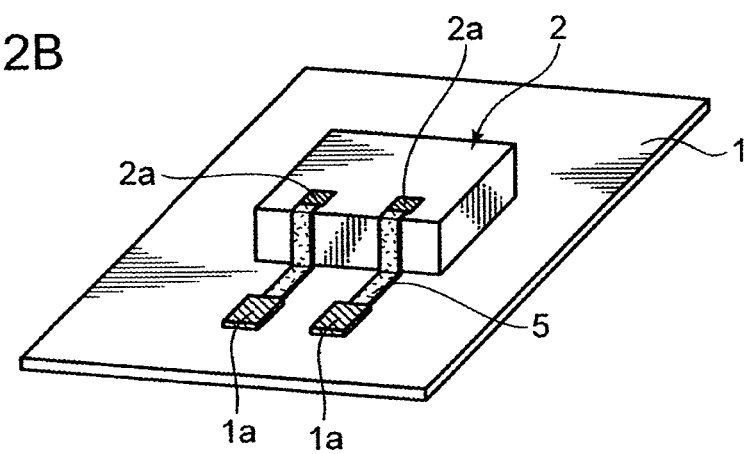

Subsequently, as shown in FIG. 2B, the resin coating 3 is removed from the surface of the insulating base material 1 and the semiconductor chip 2 by dissolving or swelling it in a predetermined liquid (coating removing step). According to this process, it is possible to cause the plating catalyst 5 to remain only on the surface of the portion where the wiring gutter 4 was formed on the surface of the insulating base material 1 and the semiconductor chip 2. Meanwhile, the plating catalyst 5 that was deposited on the surface of the resin coating 3 other than the portion where the wiring gutter 4 was formed will be removed when the resin coating 3 is removed.

As the method of removing the resin coating 3 based on swelling or dissolution, a method of dipping the resin coating 3 in a predetermined swelling liquid or dissolution liquid for a predetermined period of time can be used. Moreover, it is particularly preferable to perform ultrasonic irradiation during the dipping in order to increase the peelability and the dissolvability. Note that, in the case of peeling based on swelling, it may be separated using light force as needed.

As the liquid for causing the resin coating 3 to dissolve or swell, there is no particular limitation so as long as it is a liquid in which the resin coating 3 can be easily peeled based on dissolution or swelling without substantially decomposing or dissolving the insulating base material 1 and the plating catalyst 5. Specifically, in the case of using the photocurable epoxy resin as the resist resin, a resist remover of an organic solvent or an alkali aqueous solution is used. Moreover, for example, if an elastomer such as a diene elastomer, an acrylic elastomer or a polyester elastomer is used as the swellable resin, an alkali aqueous solution such as a sodium hydroxide aqueous solution having a concentration of roughly 1 to 10% can be preferably used.

Moreover, if polymer resin that can be obtained by polymerizing (a) at least one or more types of monomers of carboxylic acid or acid anhydride having at least one polymerizable unsaturated group in the molecules, and (b) at least one or more types of monomers that can be polymerized with the monomer of (a) above, or a resin composition containing such polymer resin, or the foregoing carboxyl group-containing acrylic resin is used as the resin coating 3, for example, an alkali aqueous solution such as a sodium hydroxide aqueous solution having a concentration of roughly 1 to 10% can be preferably used.

Upon using the plating process that is performed based on the foregoing acidic conditions in the catalyst depositing step, the resin coating 3 is preferably formed from an elastomer such as a diene elastomer, an acrylic elastomer or a polyester elastomer having a swelling level of 60% or less and preferably 40% or less under acidic conditions, and a swelling level of 50% or higher under alkaline conditions, or polymer resin that can be obtained by polymerizing (a) at least one or more types of monomers of carboxylic acid or acid anhydride having at least one polymerizable unsaturated group in the molecules, and (b) at least one or more types of monomers that can be polymerized with the monomer of (a) above, or a resin composition containing such polymer resin, or formed from the foregoing carboxyl group-containing acrylic resin. This kind of resin coating can be easily dissolved or swelled and subsequently removed by dissolution or peeling by being dipped in an alkali aqueous solution of pH 11 to 14 and preferably pH 12 to 14, for example, a sodium hydroxide aqueous solution having a concentration of roughly 1 to 10%. Note that ultrasonic irradiation may be performed during the dipping in order to increase the dissolvability or the peelability. Moreover, the resin coating can also be removed by being separated using light force as needed.

By adding a fluorescent substance to the resin coating in advance, the coating removal failure can be inspected by using the emission of light from the fluorescent substance as a result of irradiating ultraviolet light or near-ultraviolet light on the inspection target surface after the foregoing coating removing step (inspecting step). In this embodiment, a metal wiring with an extremely narrow wiring width can be formed. In the foregoing case, there is concern that the resin coating between the adjacent metal wirings will remain as a result of not being completely removed. If the resin coating remains between the metal wirings, a plating film will be formed at such portion, and this may cause a short circuit. In the foregoing case, by adding a fluorescent substance to the resin coating 3 in advance, and irradiating a predetermined light emitting source on the coating removal surface after the coating removing step and causing only the portion where the coating remains to emit light with the fluorescent substance, it is possible to inspect the existence of a coating removal failure or the location of a coating removal failure.

The fluorescent substance that may be added to the resin coating 3 is not particularly limited so as long as it shows light-emitting characteristics by irradiating light from a predetermined light source. As specific examples thereof, for example, there are Fluoresceine, Eosine, Pyronine G and the like.

The portion where the emission of light from the fluorescent substance is detected in the inspecting step is the portion where the resin coating 3 will remain. Accordingly, as a result of removing the portion where the emission of light was detected, it is possible to inhibit the formation of the plating film on such portion. It is thereby possible to inhibit short circuits from occurring.

Figure 2C:
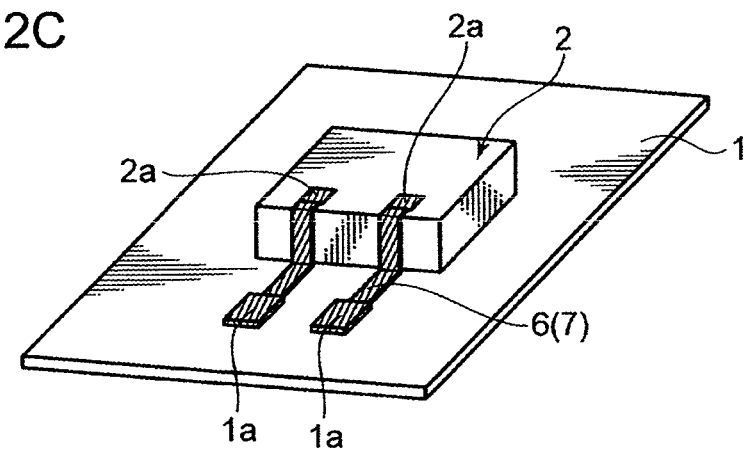

Subsequently, as shown in FIG. 2C, an electroless plating coating 6 is formed only at the site where the plating catalyst 5 remains (plating processing step). Based on this kind of process, it is possible to precipitate the electroless plating coating 6 only at the portion where the wiring gutter 4 is formed. Based this kind of electroless plating coating 6, the wiring 7 for electrically connecting the respective electrode pads 1a and each of the plurality of bonding pads 2a on the surface of the semiconductor chip 2.

As the method of the electroless plating processing, a method of dipping the insulating base material 1 mounted with the semiconductor chip 2 deposited with the plating catalyst 5 in an electroless plating solution bath, and precipitating the electroless plating coating 6 only at the portion where the plating catalyst 5 was deposited.

As the metals to be used in the electroless plating, copper (Cu), nickel (Ni), cobalt (Co), aluminum (Al) and the like may be used. Among the above, plating with Cu is preferably used as the main component since it has superior conductivity. Moreover, in the case of containing Ni, it is preferable since it has superior corrosion resistance and adhesiveness with a solder.

Through this kind of plating processing, the electroless plating coating 6 is precipitated only at the portion where the plating catalyst 5 on the surface of the path connecting the respective bonding pads 2a and the respective electrode pads 1a remains. Consequently, the wiring 7 for connecting the respective bonding pads 2a and the respective electrode pads 1a is formed. Since the portion where the wiring gutter 4 is not formed is protected by the resin coating 3 from being deposited with the plating catalyst 5, the electroless plating coating 6 is not precipitated thereon. Accordingly, even when forming a thin wiring, unneeded plating films will not remain between the adjacent wirings, and short circuits and the like can be inhibited.

With the formation of the plating film for the wiring, a thick plating film can be formed by using only the process of the electroless plating as described above, but the well-known electrolytic plating may also be concurrently used in order to shorten the cycle time of the process (electrolytic plating step). Specifically, for example, by causing the electroless plating formed in the foregoing process to be in conduction with the anode side in an electrolytic plating bath and flowing current between the electroless plating and the anode-side electrode, the portion where the electroless plating coating 6 is formed is thickened. According to this kind of method, since the thickening time can be shortened, the time required for forming the plating film can be shortened.

Although there is no particular limitation in the film thickness of the plating film formed as described above, specifically, for example, the film thickness is 0.1 to 10 μm, and more preferably around 1 to 5 μm.

Through the foregoing process, as shown in FIG. 2C, the formation in which the semiconductor chip 2 is mounted on the surface of the insulating base material 1 is formed.

The formation in which the semiconductor chip 2 is mounted on the surface of the insulating base material 1 as described above is preferably subject to resin sealing for protecting its surface by using a method such as insert molding. For this kind of sealing, the sealing methods that have been conventionally used in the production process of semiconductor devices may be used without particular limitation.

Figure 3:
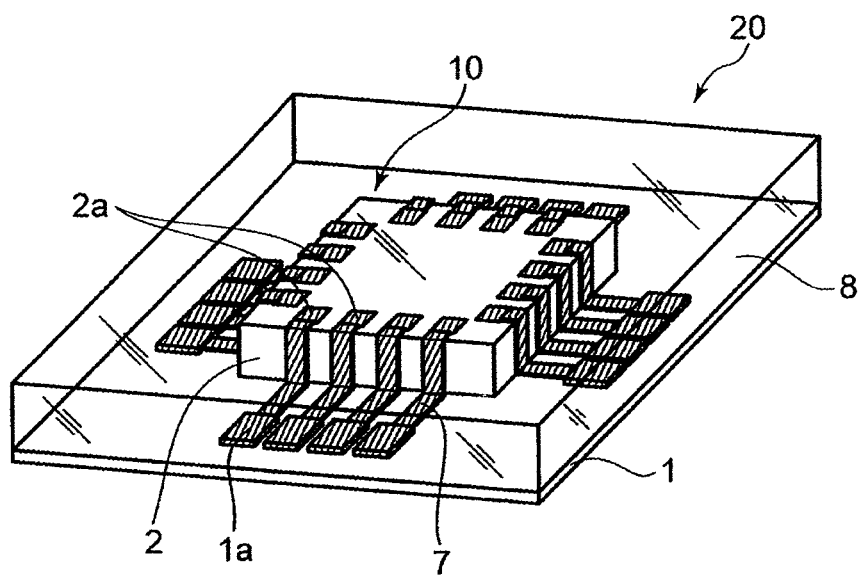
FIG. 3 is a schematic diagram of the semiconductor device that is obtained by using the method of mounting a semiconductor chip according to the first embodiment of the present invention.

FIG. 3 shows an explanatory diagram of the semiconductor device 20 obtained as a result of sealing, with the sealing material 8, the formation 10 obtained by connecting all bonding pads 2a of the semiconductor chip 2 to the electrode pads 1a based on the foregoing process. As shown in FIG. 3, a semiconductor chip 2 is disposed on the surface of the insulating base material 1 in the formation 10. In addition, the plurality of bonding pads 2a provided on the surface of the semiconductor chip 2 are respectively connected to the electrode pads 1a formed on the surface of the insulating base material 1 by the wiring 7 made from a plating film. The wiring 7 is formed so as to creep along the side face of the semiconductor chip 2 and the surface of the insulating base material 1. Thus, even in cases of producing the semiconductor device 20 by inserting the formation 10 into the mold and performing resin sealing thereto, considerably force is not applied on the wiring. Accordingly, no phenomenon will arise where the wire is subject to a load in the formation that was wire-connected via wire bonding.

Second Embodiment

A preferred method of connecting a plurality of semiconductor chips according to the present invention is now explained with reference to the drawings. Note that, since the respective processes are the same as the processes explained in the first embodiment, the detailed explanation of redundant portions is omitted. Moreover, since the components given the same reference numerals as the reference numerals of the first embodiment are the same components, the explanation thereof is omitted.

Figure 4A:
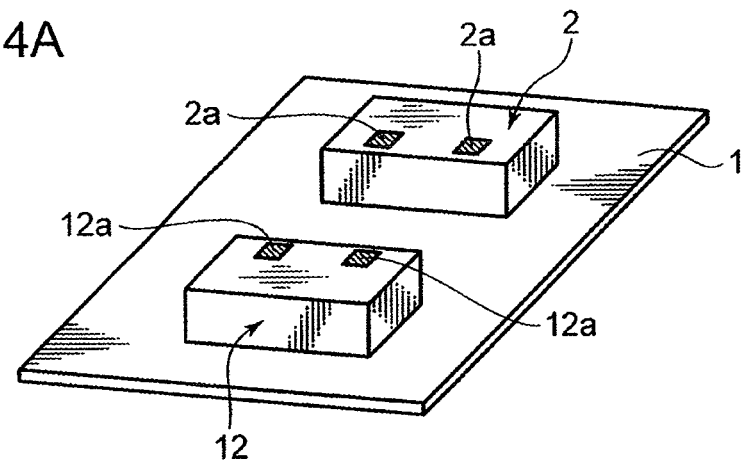
FIG. 4A to FIG. 4C are diagrams explaining the first half of the processes in the method of connecting semiconductor chips according to the second embodiment of the present invention.
Figure 4B:
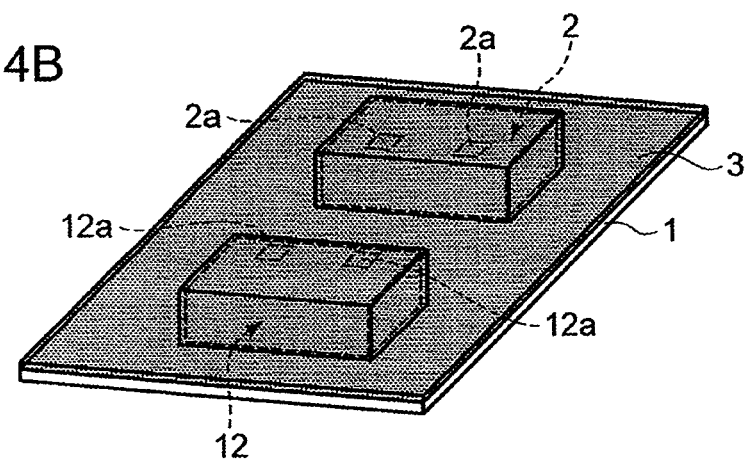

FIG. 4 and FIG. 5 are schematic diagrams explaining the respective processes in the method of connecting a plurality of semiconductor chips of this embodiment. In FIG. 4 and FIG. 5, 1 represents an insulating base material, 2 represents a first semiconductor chip, 12 represents a second semiconductor chip, 2a, 12a represent bonding pads, 3 represents a resin coating, 4 represents a wiring gutter, 5 represents a plating catalyst, and 6 represents an electroless plating coating.

In the production method of this embodiment, as shown in FIG. 4A, foremost, the insulating base material 1 in which the first semiconductor chip 2 and the second semiconductor chip 12 disposed on a predetermined chip mounting area is prepared.

The first semiconductor chip 2 and the second semiconductor chip 12 are fixed to the predetermined chip mounting area on the surface of the insulating base material 1 using an adhesive or the like, and the adhesive surface is filled with resin so that no gaps will remain. In this case also, in order to prevent the wiring 17 made of an electroless plating coating 6 from becoming directly formed on the silicon wafer (especially its side face that was subject to dicing) of the semiconductor chips 2, 12, for example, it would be more preferable to at least preliminarily cover the part of the semiconductor chips 2, 12 where the wiring 17 will be formed with an insulating organic material such as resin or an insulating organic material such as ceramics as represented by silica ($SiO_2$).

Then, as shown in FIG. 1B, a resin coating 3 is formed on the surface of the first semiconductor chip 2, the second semiconductor chip 12 and the insulating base material 1 (coating forming step).

As the method of forming the resin coating 3, there is no particular limitation so as long as it is a method which at least forms the resin coating 3 on the surface of the insulating base material 1 and the semiconductor chips 2, 12 of a path connecting the bonding pads 2a and the bonding pads 12a on the surface of the insulating base material 1, the surface of the first semiconductor chip 2 and the surface of the second semiconductor chip 12.

Figure 4C:
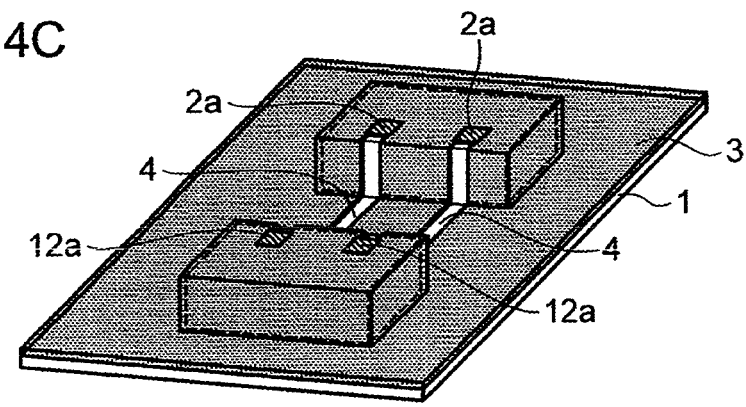

Subsequently, as shown in FIG. 4C, a wiring gutter 4 having a depth that is equal to or greater than the thickness of the formed resin coating 3 is formed (wiring gutter forming step). The wiring gutter 4 is formed, with laser beam machining, along a path for connecting the bonding pads 2a on the surface of the first semiconductor chip 2 and the bonding pads 12a on the surface of the second semiconductor chip 12.

The wiring gutter 4 is formed along the path for connecting the bonding pads 2a and the bonding pads 12a as described above. As a result of forming this kind of wiring gutter 4, a wiring is formed by the electroless plating coating 6 only being formed on the surface of the portion where the wiring gutter 4 is formed in the subsequent process.

Figure 5A:
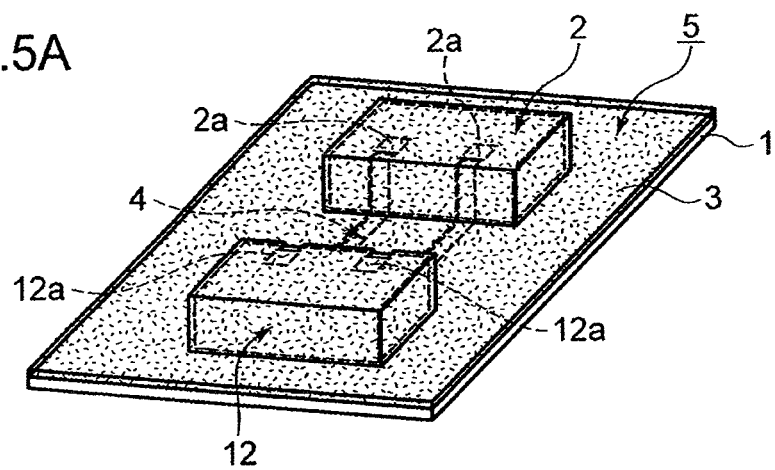
FIG. 5A to FIG. 5C are diagrams explaining the second half of the processes in the method of connecting semiconductor chips according to the second embodiment of the present invention.

Subsequently, as shown in FIG. 5A, a plating catalyst 5 is deposited on a surface on which the wiring gutter 4 is at least formed (catalyst depositing step). Based on this kind of catalyst depositing treatment, the plating catalyst 5 is deposited on the surface of the wiring gutter 4 and the surface of the resin coating 3.

Figure 5B:
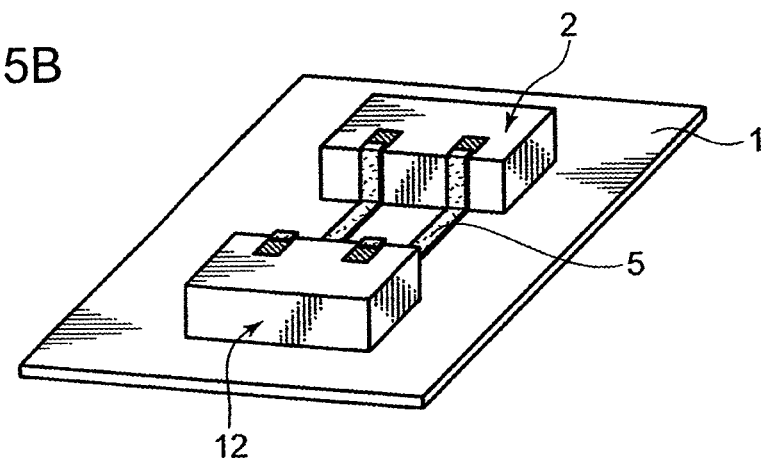

Subsequently, as shown in FIG. 5B, the resin coating 3 is removed from the surface of the insulating base material 1, the first semiconductor chip 2 and the second semiconductor chip 12 by being dissolved or swelled in a predetermined liquid (coating removing step). According to this process, it is possible to cause the plating catalyst 5 to remain only on the surface of the portion where the wiring gutter 4 was formed on the surface of the insulating base material 1, the first semiconductor chip 2 and the second semiconductor chip 12. Meanwhile, the plating catalyst 5 that was deposited on the surface other than the portions where the wiring gutter 4 was formed is removed upon removing the resin coating 3.

Figure 5C:
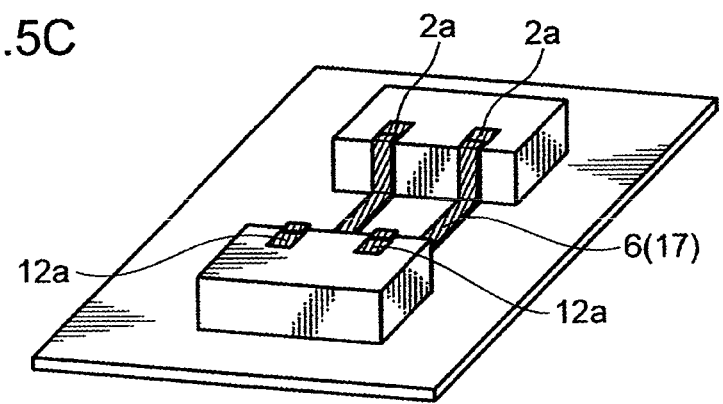
Figure 6:
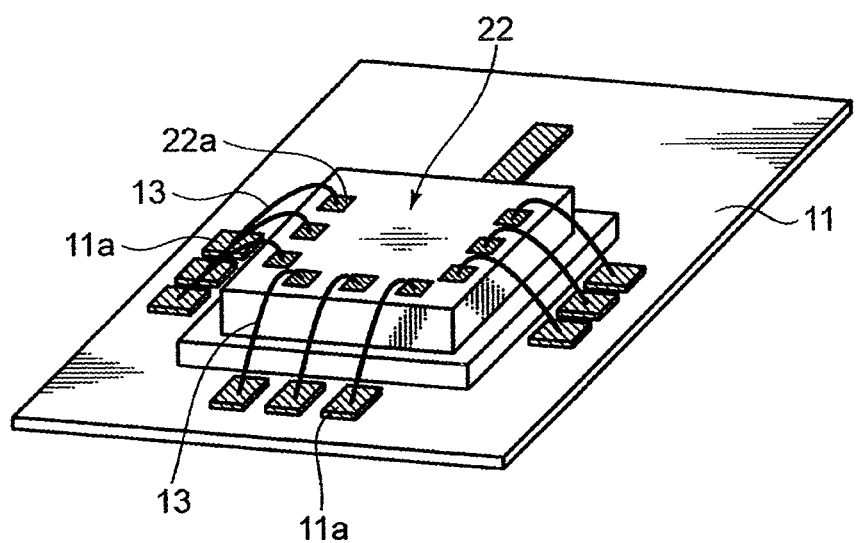
FIG. 6 is a schematic diagram schematically showing the mounting configuration of a conventional semiconductor device that is wire-connected based on the wire bonding method.

Subsequently, as shown in FIG. 5C, an electroless plating coating 6 is formed only at the site where the plating catalyst 5 remains (plating processing step). Based on this kind of process, the electroless plating coating 6 is precipitated only on the portion where the wiring gutter 4 was formed. As a result of this kind of electroless plating coating 6, a wiring 17 for electrically connecting the bonding pads 2a and the bonding pads 12a is formed.

Through this kind of plating processing, the electroless plating coating 6 is precipitated only at the portion where the plating catalyst 5 remains on the surface of the path connecting the bonding pads 2a, 2a of the first semiconductor chip 2 and the bonding pads 12a, 12a of the second semiconductor chip 12. The wiring 17 for connecting the bonding pads 2a and the bonding pads 12a is thereby formed. As a result of performing this kind of process, a formation in which the first semiconductor chip 2 and the second semiconductor chip 12 mounted on the surface of the insulating base material 1 are electrically connected as shown in FIG. 5C is thereby formed.

According to this kind of connection method, since the wiring can be formed over the difference in level caused by the semiconductor chip, the plurality of semiconductor chips formed on the substrate can be electrically connected mutually with a simple method. Accordingly, a multi chip module or the like in which a plurality of semiconductor chips are integrated can be realized easily.

Third Embodiment

According to the method described in the Non-Patent Document 1, a wiring for connecting the insulating base material and the semiconductor chip disposed on a surface of the insulating base material can be formed three-dimensionally across the insulating base material surface and the semiconductor chip surface along the upper surface of the semiconductor chip, the side wall of the semiconductor chip, and the surface of the insulating base material. In other words, the wiring is formed three-dimensionally across two or more adjacent faces on the surface of the three-dimensional structure in which a semiconductor chip is disposed on the surface of the insulating base material. Accordingly, the three-dimensional wiring formed as described above will be stronger than the wiring formed based on wire bonding since it is formed in a manner of creeping along the surface while being in contact with the surface of the insulating base material and the semiconductor chip, and is able to inhibit the damage of the wiring caused by the resin pressure during the resin sealing.

Figure 7:
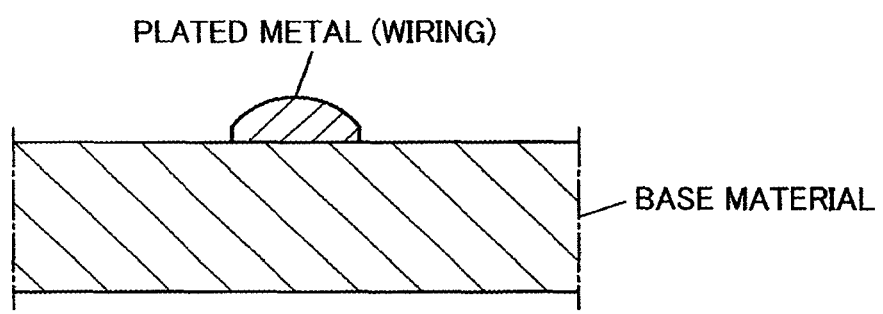
FIG. 7 is a diagram showing the state on the base material surface of the three-dimensional wiring obtained with the method described in Non-Patent Document 1.

Nevertheless, according to studies conducted by the present inventors, since the three-dimensional wiring obtained with the method described in Non-Patent Document 1 is in a state where the plated metal configuring the wiring is merely placed on the base material surface or the chip surface while being in contact with such surface as shown in FIG. 7, the adhesive strength of the wiring to the base material and the chip is weak, and there is a problem in that the wiring easily falls from the base material surface or the chip surface or easily becomes dislocated on the surface. In particular, the three-dimensional structure includes a corner part of a mountain line protruding outward, and, for example, if the wiring passes through such corner part such as a corner part where the upper surface and the side wall of the chip intersect, the wiring will be in a state of protruding further outward than the corner part. Thus, if the adhesive strength of the wiring is weak, the wiring will be even more susceptible to falling or dislocation due to external force. Moreover, if the plated metal is merely placed on the surface of the base material or the like, since most of the plated metal will be exposed to the outside, the wiring is easily disconnected due to the repetition of expansion and contraction caused by heat or as a result of being subject to physical external force such as vibration, and there is a possibility that it may lose its reliability as an electrical component. This kind of problem is more prone to occur as the line width of the wiring becomes thinner and narrower.

The present invention was devised based on the results of the foregoing studies. Accordingly, another object of this invention is to improve the adhesive strength of the wiring relative to a three-dimensional structure in which a wiring is provided on its structure, and consequently reduce problems such as the falling, dislocation and disconnection of the wiring. Details of the third embodiment of the present invention are now explained.

Figure 8A:
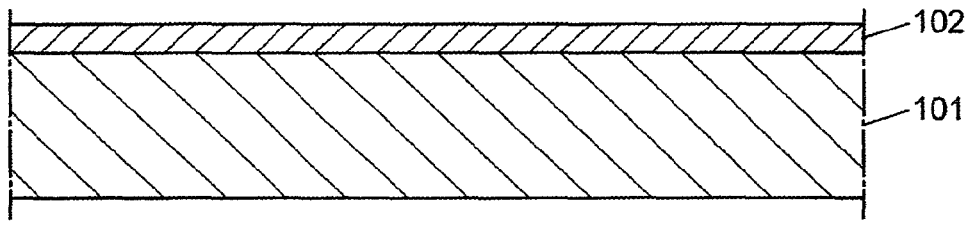
FIG. 8A to FIG. 8E are process charts corresponding to FIG. 1B to FIG. 1C or FIG. 4B to FIG. 4C and FIG. 2A to FIG. 2C or FIG. 5A to FIG. 5C in cases of forming a wiring gutter having a depth that is the same as the thickness of the resin coating.
Figure 8B:
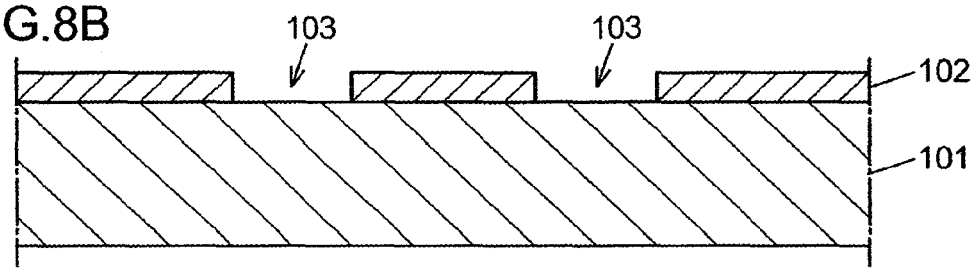
Figure 8C:
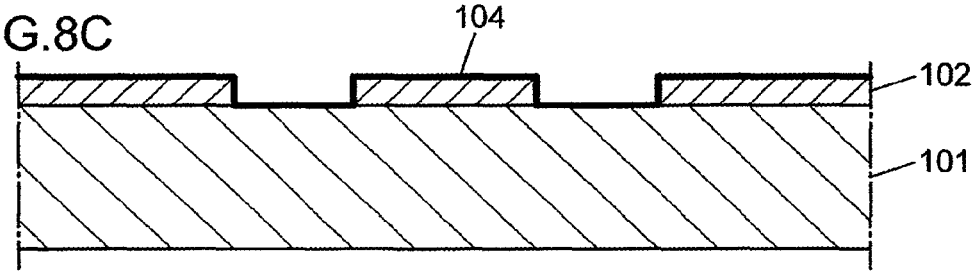
Figure 8D:
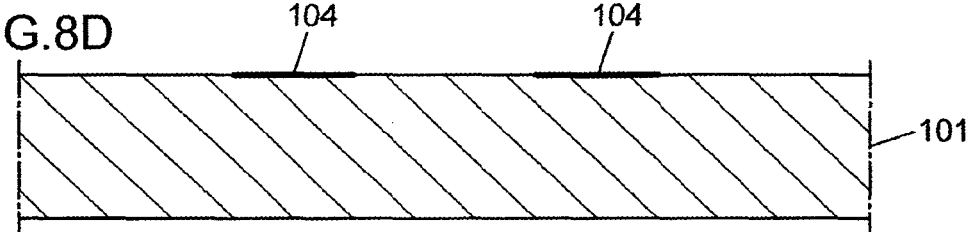
Figure 8E:
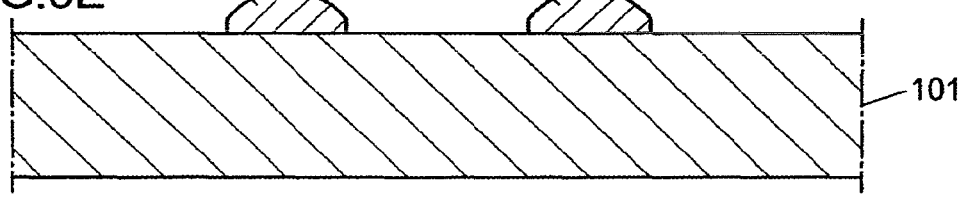

At first, if a wiring gutter having a depth that is equal to the thickness of the resin coating in the first embodiment and the second embodiment, generally speaking, the wiring is formed as follows. Specifically, as shown in FIG. 8A, in the coating forming step, a resin coating 102 is formed on a surface of an insulating base material 101 (although this may also be a semiconductor chip, the insulating base material is used as a representative example for the sake of convenience; hereinafter the same). Subsequently, as shown in FIG. 8B, in the wiring gutter forming step, a wiring gutter 103 having a depth that is equal to the thickness of the resin coating 102 is formed along a wiring path with laser beam machining. Here, a recessed gutter for wiring is not formed on a surface of the insulating base material 101. In other words, the surface of the insulating base material 101 is not cut. Subsequently, as shown in FIG. 8C, in the catalyst depositing step, a plating catalyst 104 is deposited on a surface of the wiring gutter 103 and a surface of the resin coating 102. The plating catalyst 104 is deposited on a surface of the insulating base material 101. Subsequently, as shown in FIG. 8D, in the coating removing step, the resin coating 102 is removed by being dissolved or swelled in a predetermined liquid. Then, as shown in FIG. 8E, in the plating processing step, a plated metal 105 is precipitated with electroless plating so as to form the wiring 106 only at a site where the plating catalyst 104 remains. The plated metal 105 is precipitated on the surface of the insulating base material 101.

In the foregoing case, as shown in FIG. 8E, the plated layer 105 as the wiring conductor configuring the wiring 106 is in a state of merely being placed on the surface of the insulating base material 101 or the surface of the semiconductor chip while being in contact with such surface. This state is the same as the state of the wiring (refer to FIG. 7) that is obtained with the method described in foregoing Non-Patent Document 1. In such state, the adhesive strength of the wiring 106 to the insulating base material 101 or the semiconductor chip is weak, and there is a problem in that the wiring 106 easily falls from the surface of the insulating base material 101 or the surface of the semiconductor chip. Moreover, the wiring 106 easily becomes dislocated on the surface of the insulating base material 101 or the surface of the semiconductor chip. In particular, a three-dimensional structure such as a semiconductor device in which a semiconductor chip is mounted on the insulating base material 101 includes a corner part of a mountain line protruding outward, and, for example, if the wiring 106 passes through such corner part such as a corner part where the upper surface and the vertical side wall of the semiconductor chip intersect as shown in FIG. 2C or FIG. 5C, the wiring 106 will be in a state of protruding further outward than the corner part. Thus, if the adhesive strength of the wiring 106 is weak, the wiring 106 will be even more susceptible to falling or dislocation due to external force. Moreover, if the plated metal 105 is merely placed on the surface of the insulating base material 101 or the semiconductor chip, since most of the plated metal 105 will be exposed to the outside, the wiring 106 is easily disconnected due to the repetition of expansion and contraction caused by heat or as a result of being subject to physical external force such as vibration, and there is a possibility that it may lose its reliability as an electrical component.

Figure 9A:
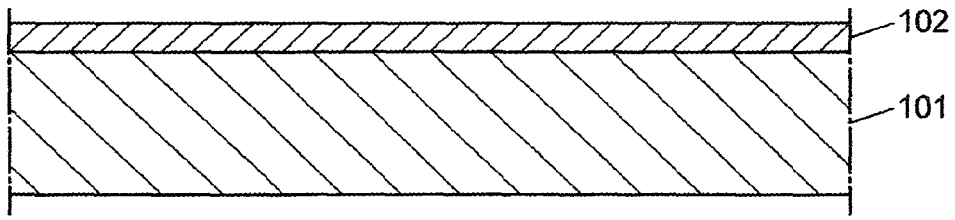
FIG. 9A to FIG. 9E are process charts corresponding to FIG. 1B to FIG. 1C or FIG. 4B to FIG. 4C and FIG. 2A to FIG. 2C or FIG. 5A to FIG. 5C in cases of forming a wiring gutter having a depth that is greater than the thickness of the resin coating.
Figure 9B:
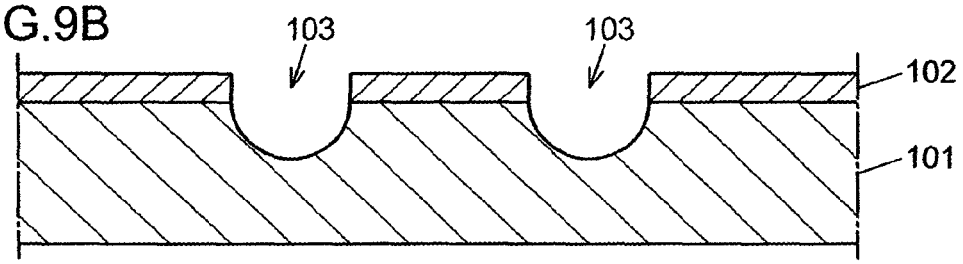
Figure 9C:
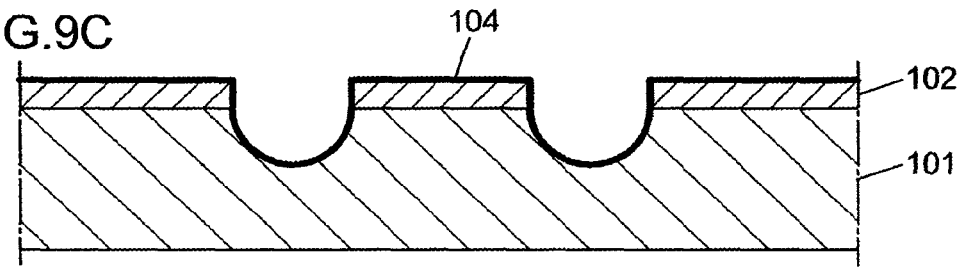
Figure 9D:
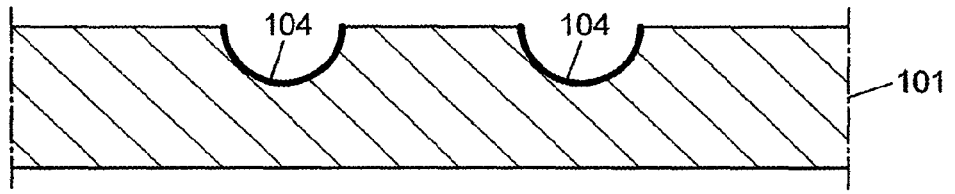
Figure 9E:
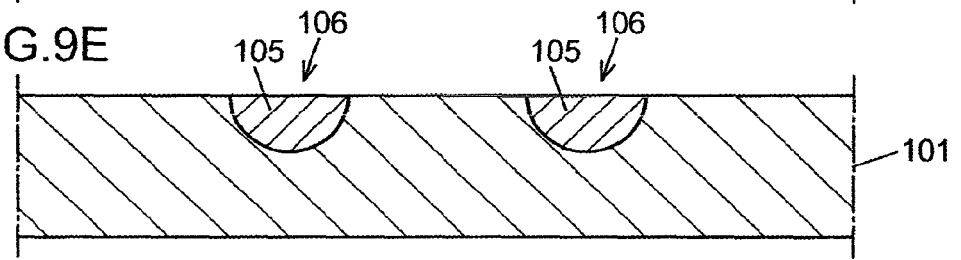

Meanwhile, if a wiring gutter having a depth that is greater than the thickness of the resin coating in the first embodiment and the second embodiment, generally speaking, the wiring is formed as follows. Specifically, as shown in FIG. 9A, in the coating forming step, a resin coating 102 is formed on a surface of an insulating base material 101. Subsequently, as shown in FIG. 9B, in the wiring gutter forming step, a wiring gutter 103 having a depth that is greater than the thickness of the resin coating 102 is formed along a wiring path with laser beam machining. Here, the portion exceeding the thickness of the resin coating 102 in the wiring gutter 103 is formed as a recessed gutter for wiring on the surface of the insulating base material 101. Subsequently, as shown in FIG. 9C, in the catalyst depositing step, a plating catalyst 104 is deposited on a surface of the wiring gutter 103 and a surface of the resin coating 102. The plating catalyst 104 is also deposited in the recessed gutter for wiring. Subsequently, as shown in FIG. 9D, in the coating removing step, the resin coating 102 is removed by being dissolved or swelled in a predetermined liquid. The plating catalyst 104 in the recessed gutter for wiring will remain. Then, as shown in FIG. 9E, in the plating processing step, a plated metal 105 is precipitated with electroless plating so as to form the wiring 106 at a site only where the plating catalyst 104 remains. The plated metal 105 is precipitated in the recessed gutter for wiring and fills the recessed gutter for wiring.

In the foregoing case, as shown in FIG. 9E, the plated metal 105 as the wiring conductor configuring the wiring 106 becomes a state of being embedded in a recessed grove for wiring that is formed on the surface of the insulating base material 101 or the surface of the semiconductor chip. Accordingly, the adhesive strength of the wiring 106 to the insulating base material 101 and the semiconductor chip will improve. Consequently, even if the wiring 106 passes through the corner part of a mountain line protruding outward of the three-dimensional structure, problems such as the falling and dislocation of the wiring 106 can be reduced. Moreover, since the plated metal 105 is embedded in the recessed gutter for wiring, problems such as the wiring 106 being disconnected due to physical external force can also be reduced.

Figure 10A:
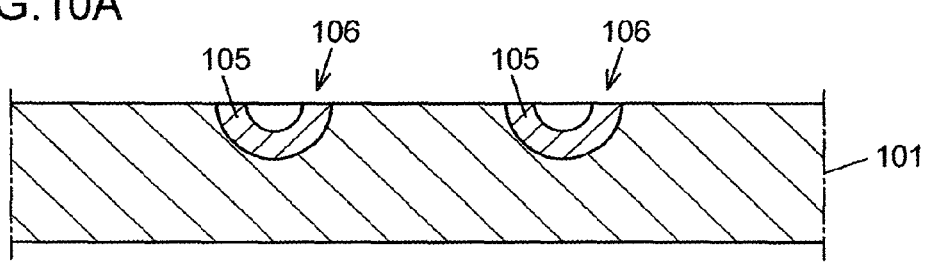
FIG. 10A to FIG. 10C are diagrams showing modified examples of the wiring obtained in FIG. 9E.
Figure 10B:
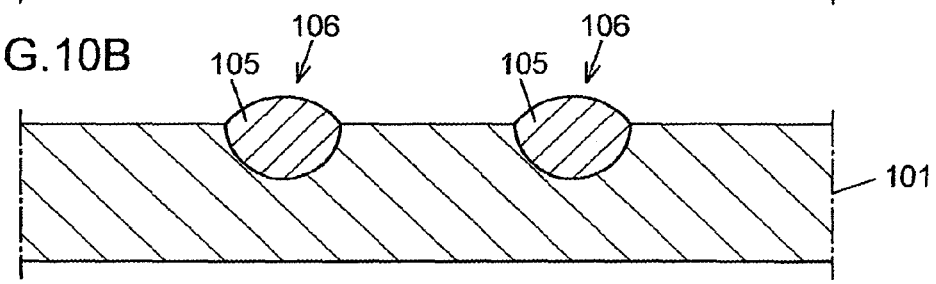
Figure 10C:
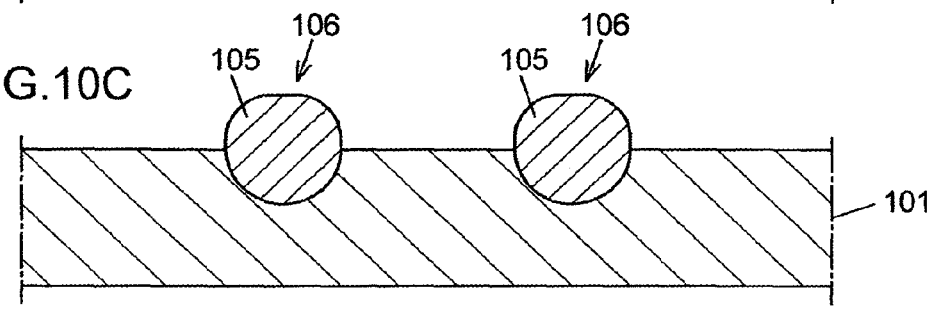

Although FIG. 9E is an example of the wiring 106 in which the entire plated metal 105 as the wiring conductor is embedded in the recessed gutter for wiring, and the surface of the plated metal 105 and the surface of the insulating base material 101 are flush, the configuration is not limited thereto, and, for example, as shown in FIG. 10A, it may also be a wiring 106 in which the entire plated metal 105 is embedded in the recessed gutter for wiring, but the surface of the plated metal 105 is not flush with the surface of the insulating base material 101 and is retreated more inward of the recessed gutter for wiring. Moreover, as shown in FIG. 10B, it may also be a wiring 106 in which a part of the plated metal 105 is embedded in the recessed gutter for wiring, but the remaining portions of the plated metal 105 are protruding outside the surface of the insulating base material 101. Moreover, as shown in FIG. 10C, even if the amount of the other portions of the plated metal 105 protruding outside the surface of the insulating base material 101 is relatively large, so as long as a part of the plated metal 105 is embedded in the recessed gutter for wiring, it falls within the scope of the present invention, and yields the effect of the present invention.

Figure 11A:
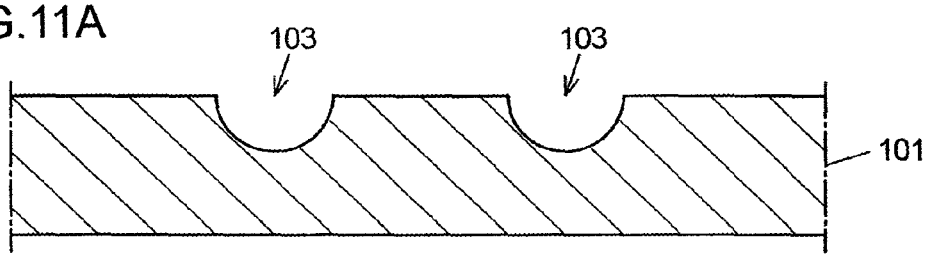
FIG. 11A to FIG. 11C are process charts showing the wiring forming method using CMP treatment.
Figure 11B:
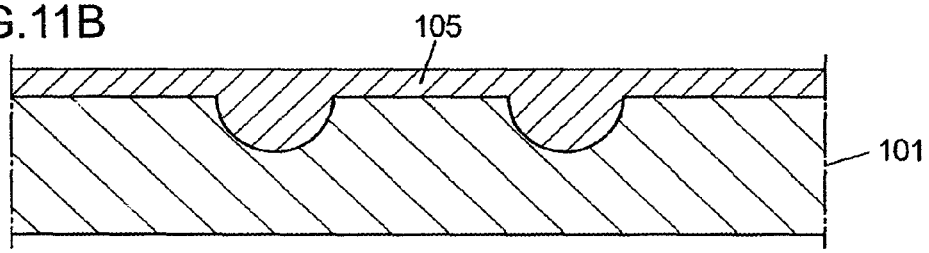
Figure 11C:
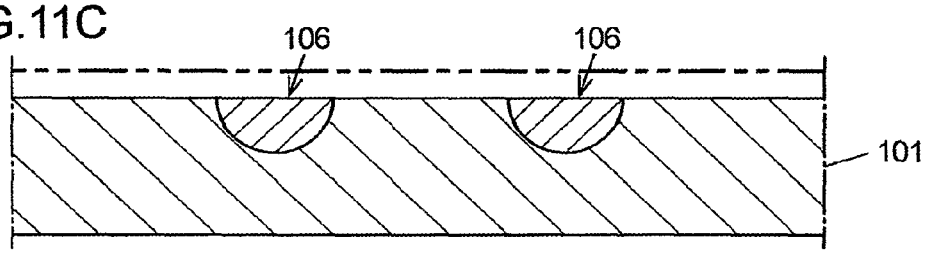

Moreover, as shown in FIG. 9E and FIG. 10A, the wiring 106 in which the entire wiring conductor 105 is embedded in the recessed gutter for wiring can also be obtained based on embedded wiring formation techniques using CMP (Chemical Mechanical Polishing) treatment. Specifically, as shown in FIG. 11A, a wiring gutter 103 is formed as a recessed gutter for wiring on the surface of the insulating base material 101, subsequently, as shown in FIG. 11B, a wiring conductor 105 is formed inside the wiring gutter 103 and on the surface of the insulating base material 101 so as to fill the wiring gutter 103, and, subsequently, as shown in FIG. 11C, the wiring conductor 105 outside the wiring gutter 103 is removed with the CMP treatment so as to form a wiring 106 in which the entire wiring conductor 105 is embedded in the recessed gutter for wiring.

Figure 12:
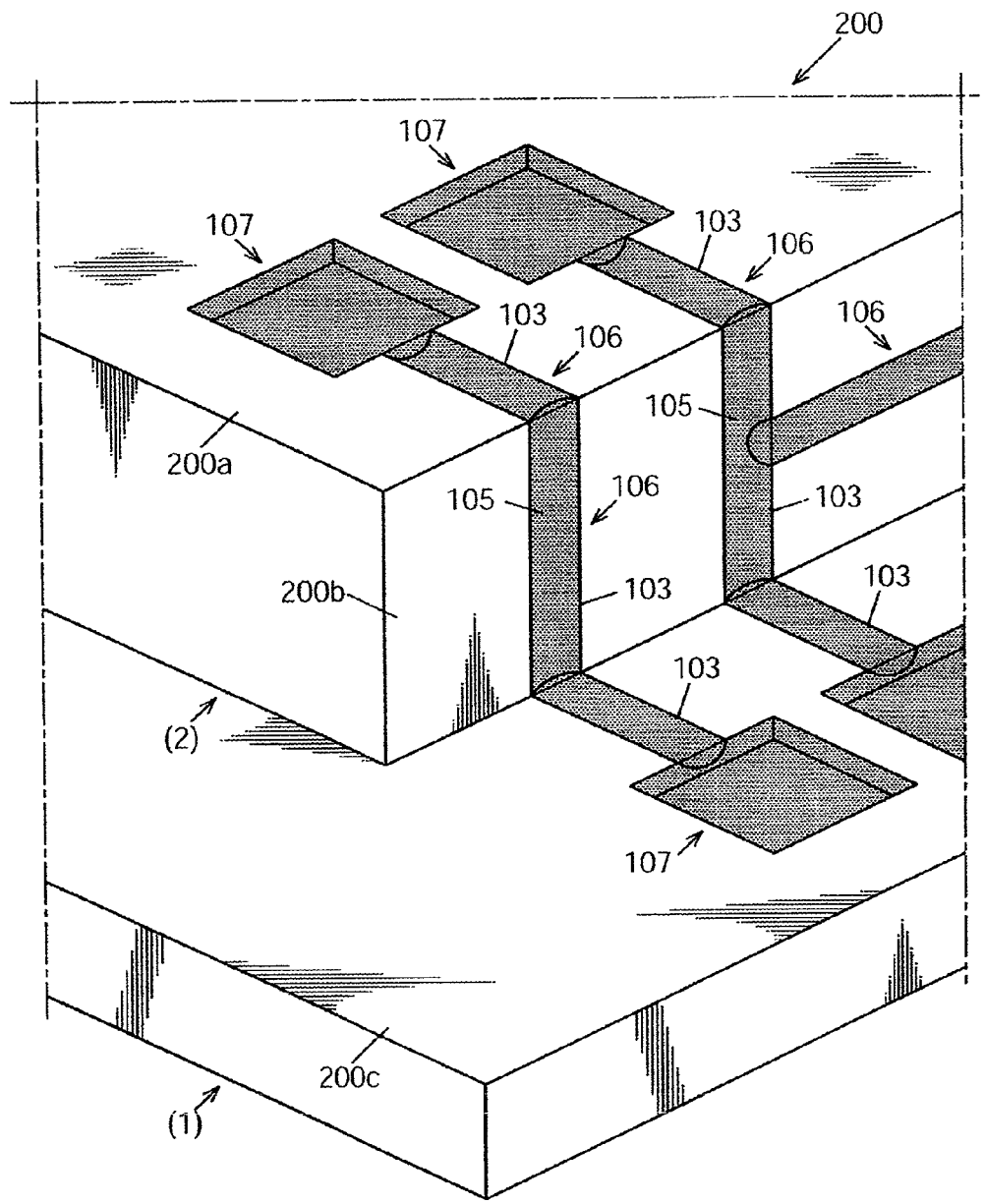
FIG. 12 is an enlarged perspective view showing the relevant part of the three-dimensional structure in which a wiring is provided on its surface according to the third embodiment of the present invention.

Accordingly, based on the above, this third embodiment relates to a three-dimensional structure 200 in which a wiring 106 is provided on its surface as shown in FIG. 12, wherein a recessed gutter for wiring 103 extending between the mutually intersecting adjacent faces 200a, 200b, 200c or on a planar surface or a curved surface (including a bent curved surface, a concave curved surface, a convex curved surface, and a curved surface of the combinations thereof) of the three-dimensional structure 200 is formed on the surface of the three-dimensional structure 200, and at least a part of the wiring conductor 105 is embedded in the recessed gutter for wiring 103. Note that, at least a part of the wiring conductor 105 may be embedded in the recessed gutter for wiring 103 across the entire length of the recessed gutter for wiring 103, or it may be embedded at one portion, embedded at a plurality of portions, or embedded partially or intermittently in the entire length of the recessed gutter for wiring 103.

As specific examples of the three-dimensional structure 200, there are the following:

(1) A semiconductor device in which a semiconductor chip is mounted on an insulating base material as in the first embodiment (as described above, in order to prevent the wiring made of an electroless plating coating from becoming directly formed on the silicon wafer (especially its side face that was subject to dicing) of the semiconductor chip, for example, it would be more preferable to at least preliminarily cover the part of the semiconductor chip where the wiring will be formed with an insulating organic material such as resin or an insulating organic material such as ceramics as represented by silica ($SiO_2$));

(2) A three-dimensionally-shaped circuit board;

(3) A multilayered circuit board;

(4) A stacked chip package in which a plurality of semiconductor chips are mounted on an insulating base material in a state of being stacked in multiple stages (in this case also, in order to prevent the wiring made of an electroless plating coating from becoming directly formed on the silicon wafer (especially its side face that was subject to dicing) of the semiconductor chip, for example, it would be more preferable to at least preliminarily cover the part of the semiconductor chip where the wiring will be formed with an insulating organic material such as resin or an insulating organic material such as ceramics as represented by silica ($SiO_2$));

(5) A semiconductor device configured such that a semiconductor chip (for instance, a memory package or the like) that is mounted on an insulating base material or a semiconductor chip that is not mounted on an insulating base material is coated with insulating resin (an insulating organic material such as resin or an insulating organic material such as ceramics as represented by silica ($SiO_2$) may also be used in substitute for the insulating resin);

(6) A memory card in which the memory package is mounted on a support medium;

(7) An electrical device (for instance, a magnetic head or the like) configured such that a passive element (for instance, a resistor, a capacitor, a coil, various sensors or the like) that is mounted on an insulating base material or a passive element that is not mounted on an insulating base material is coated with insulating resin (an insulating organic material such as resin or an insulating organic material such as ceramics as represented by silica ($SiO_2$) may also be used in substitute for the insulating resin); and (8) A magnetic head module or the like in which the magnetic head is mounted on a harness.

Then, on the surface of the three-dimensional structure 200, formed is a three-dimensional wiring 106 in which at least a part of the wiring conductor 105 is embedded in the recessed gutter for wiring 103. According to the three-dimensional structure 200 configured as described above, since at least a part of the wiring conductor 105 is embedded in the recessed gutter for wiring 103 extending between mutually intersecting adjacent faces of the three-dimensional structure 200 (when referring to FIG. 12, an upper surface 200a of the upper row configuring a difference in level, a vertical side face 200b configuring a difference in level, and an upper surface 200c of the lower row configuring a difference in level), even if the line width of the wiring 106 is thin and narrow, the adhesive strength of the wiring 106 to the three-dimensional structure 200 is improved. Consequently, even if the wiring 106 passes through the corner part of a mountain line protruding outward of the three-dimensional structure 200 (when referring to FIG. 12, the corner part where the upper surface 200a of the upper row and the vertical side face 200b intersect), problems such as the falling and dislocation of the wiring 106 can be reduced. Moreover, since at least a part of the wiring conductor 105 is embedded in the recessed gutter for wiring 103, problems such as the wiring 106 being disconnected due to physical external force can also be reduced.

The wiring 106 is a three-dimensional wiring that is provided on the surface of the three-dimensional structure 200, and the wiring is formed so as to creep along the surface of the three-dimensional structure 200 while being in contact with such surface. Accordingly, there is no need to give consideration to the phenomena such as a wire sweep in the wire bonding, and extremely high wiring density can be achieved. Moreover, if the entire wiring conductor 105 is embedded in the recessed gutter for wiring 103, the wiring 106 will not be easily affected from the outside, and problems such as the falling, dislocation and disconnection of the wiring 106 can be inhibited more effectively.

The three-dimensional structure 200 may be a resin molded product or an inorganic insulating molded product. Moreover, the three-dimensional structure 200 may be an integration as a result of separately preparing the components and thereafter integrating such components. For example, it may be a complex like a semiconductor device in which, as a result of a semiconductor chip being mounted on an insulating base material, and difference in level was created across the entirety thereof. Otherwise, the three-dimensional structure 200 may be an integration where the respective components are integrated from the very beginning. This kind of compact is preferably prepared by injection molding from the perspective of production efficiency. Specific materials and modes in cases where the three-dimensional structure 200 is, for example, a circuit board or a resin molded product are explained below. Meanwhile, if the three-dimensional structure 200 is an inorganic insulating molded product, for example, various ceramic compacts such as ceramic substrates produced by sintering a green sheet obtained by tape-molding a slurry in which an organic binder or aqueous solvent is mixed and dispersed in the glass ceramic powder or the like can be favorably adopted.

If the three-dimensional structure 200 is, for example, a circuit board or a resin molded product, there is no particular limitation in the materials that can be used in the production of the three-dimensional structure 200, and various organic base materials and inorganic base materials that have been conventionally used for the production of circuit boards can be used. As specific examples of an organic base material, there are the based materials made of epoxy resin, acrylic resin, polycarbonate resin, polyimide resin, polyphenylene sulfide resin, polyphenylene ether resin, cyanate resin, benzoxazine resin, bismaleimide resin, and the like.

As the epoxy resin, there is no particular limitation so as long as it is epoxy resin configuring the various organic substrates that can be used in the production of a circuit board. Specifically, for example, bisphenol A-type epoxy resin, bisphenol F-type epoxy resin, bisphenol S-type epoxy resin, aralkyl epoxy resin, phenol novolac-type epoxy resin, alkyl phenol novolac-type epoxy resin, biphenol-type epoxy resin, naphthalene-type epoxy resin, dicyclopentadiene-type epoxy resin, aromatic aldehyde containing phenols and phenolic hydroxyl group and epoxy compound of its condensation product, triglycidyl isocyanurate, alicyclic epoxy resin and the like may be used. In addition, brominated or phosphorus-modified epoxy resin, nitrogen-containing resin, silicon-containing resin and the like for providing flame resistance may also be used. Moreover, as the epoxy resin and resin, the foregoing epoxy resins and resins may be used alone or in combination of two or more types.

When configuring the three-dimensional structure 200 with the respective resins, generally speaking, a curing agent is added for hardening the resin. There is no particular limitation in the curing agent so as long as it can be used as a curing agent. Specifically, for example, dicyandiamide, phenolic curing agent, acid anhydride curing agent, aminotriazine novolac curing agent, cyanate resin and the like may be used.

As the phenolic curing agent, for example, a novolac type, an aralkyl type, a terpene type or the like may be used. In addition, phosphorus-modified phenol resin, phosphorus-modified cyanate resin, or the like for providing flame resistance may also be used. Moreover, as the curing agent, the foregoing curing agents may be used alone or in combination of two or more types.

Since a concave part 3 for the circuit is formed as the circuit pattern on the surface of the three-dimensional structure 200 in the wiring gutter forming step based on laser beam machining, it is preferable to use resin or the like with favorable absorptance (UV absorptance) of laser beams in a wavelength region of 100 run to 600 am. For example, specifically, polyimide resin or the like may be used.

The three-dimensional structure 200 may contain a filler. As the filler, inorganic fine particles or organic fine particles may be used, and there is no particular limitation. As a result of containing a filler, the filler will be exposed on the laser beam machining part and the adhesion of the plating (conductor 5) and the resin (three-dimensional structure 200) based on the unevenness of the filler will improve.

As the materials for configuring the inorganic fine particles, specifically, for example, high-dielectric filling materials such as aluminum oxide ($Al_2O_3$), magnesium oxide (MgO), boron nitride (BN), aluminum nitride (AlN), silica ($SiO_2$), and barium titanate ($BaTiO_3$), titanium oxide ($TiO_2$); magnetic filling materials such as hard ferrite; inorganic flame retardants such as magnesium hydroxide ($Mg(OH)_2$), aluminum hydroxide ($Al(OH)_2$), antimony trioxide ($Sb_2O_3$), antimony pentoxide ($Sb_2O_s$), guanidine salt, zinc borate, molybdenum compound, and zinc stannate; talc ($Mg_3(Si_4O_{10})(OH)_2$), barium sulfate ($BaSO_4$), calcium carbonate ($CaCO_3$), mica and the like may be used. As the inorganic fine particles, the inorganic fine particles may be used alone or in combination of two or more types. Since these inorganic fine particles have a high degree of freedom of thermal conductivity, relative permittivity, flame resistance, particle size distribution, and color tone, they can be highly filled easily based on appropriate blending and particle size design when selectively exhibiting the intended function. Moreover, although there is no particular limitation, it is preferable to use a filler having an average particle size that is not greater than the thickness of the insulating layer; specifically, a filler having an average particle size of preferably 0.01 µm to 10 µm, and more preferably 0.05 µm to 5 µm.

Moreover, the inorganic fine particles may be subject to surface treatment with a silane coupling agent for increasing the dispersibility in the three-dimensional structure 200. Moreover, the three-dimensional structure 200 may also contain a silane coupling agent for increasing the dispersibility of the inorganic fine particles in the three-dimensional structure 200. There is no particular limitation in the silane coupling agent that may be used. Specifically, for example, silane coupling agents of epoxy silane, mercapto silane, amino silane, vinyl silane, styryl silane, methacryloxy silane, acryloxy silane, titanate and the like may be used. As the silane coupling agent, the foregoing silane coupling agents may be used alone or in combination of two or more types.

Moreover, the three-dimensional structure 200 may contain a dispersant for increasing the dispersibility of the inorganic fine particles in the three-dimensional structure 200. There is no particular limitation in the dispersant that may be used. Specifically, for example, dispersants of alkyl ether, sorbitan ester, alkyl polyether amine, macromolecular dispersant and the like may be used. As the dispersant, the foregoing dispersants may be used alone or in combination of two or more types.

Moreover, as specific examples of the organic fine particles that can be used as the filler, used may be, for example, rubber fine particles and the like.

There is no particular limitation in the form of the three-dimensional structure 200. Specifically, it may be a sheet, a film, a prepreg, a three-dimensionally shaped compact or the like. There is no particular limitation in the thickness of the three-dimensional structure 200, and, for example, in the case of a sheet, a film, a prepreg or the like, the thickness is, for example, 10 to 2000 µm, preferably 10 to 500 µm, more preferably 10 to 200 µm, more preferably 20 to 200 µm, and more preferably around 20 to 100 µm.

Moreover, the three-dimensional structure 200 may be formed into a three-dimensionally shaped compact by placing the material to become the three-dimensional structure 200 in, for example, a mold or a frame, and performing pressurization and hardening thereto, or a sheet, a film or a prepreg may be punched and hardened, or hardened through heating and pressurization in order to form the three-dimensionally shaped compact or the like.

As shown in FIG. 12, the pad part 107 may also be provided on the surface of the three-dimensional structure 200. The pad part 107 is an electrode pad that is in conduction with the internal circuit of the three-dimensional structure 200, or a bonding pad for mounting components on the three-dimensional structure 200, or the like. If the wiring 106 is connected to the electrode pad 107, the wiring 106 will be connected to the internal circuit of the three-dimensional structure 200 that is in conduction with the electrode pad 107. Meanwhile, if the wiring 106 is connected to the bonding pad 107, the wiring 106 will be connected to the components mounted on the bonding pad 107.

Figure 13:
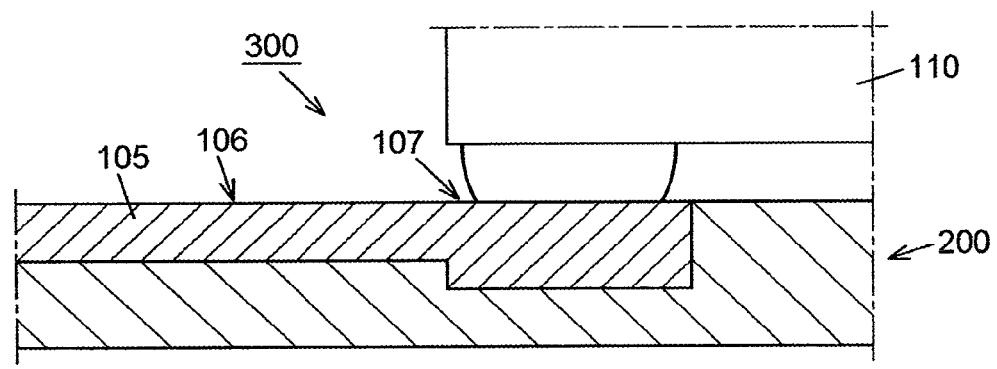
FIG. 13 is an enlarged cross section showing a specific example of the configuration of the pad part in the three-dimensional structure.

In the foregoing case, as shown in FIG. 13, the pad part 107 may be formed integrally with the wiring 106 by being embedded on the surface of the three-dimensional structure 200 (by embedding a part or all of the pad part 107). As the method of forming the pad part 107 integrally with the wiring 106 by being embedded on the surface of the three-dimensional structure 200, for example, in the wiring gutter forming step of FIG. 9B described above, a hole for the pad part is formed in succession with the wiring gutter 103, in the catalyst depositing step of FIG. 9C described above, the plating catalyst 104 is also deposited in the hole for the pad part, in the coating removing step of FIG. 9D described above, the plating catalyst 104 in the hole for the pad part is caused to remain, and in the plating processing step of FIG. 9E described above, the plated metal 105 is also precipitated in the hole for the pad part via electroless plating so as to form the pad part 107. Note that, in FIG. 13 reference numeral 300 shows the semiconductor device in which a component 110 such as a semiconductor chip is mounted on the pad part 107 of the three-dimensional structure 200.

Figure 14A:
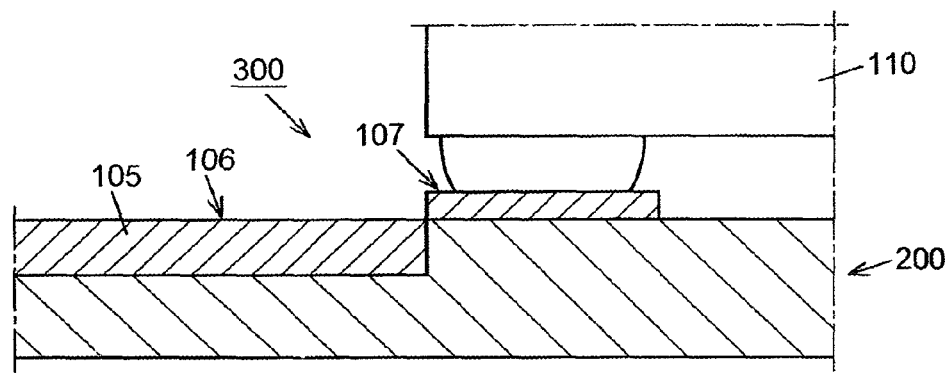
FIG. 14A is an enlarged cross section showing an undesirable example of the configuration of the pad part in the three-dimensional structure.
Figure 14B:
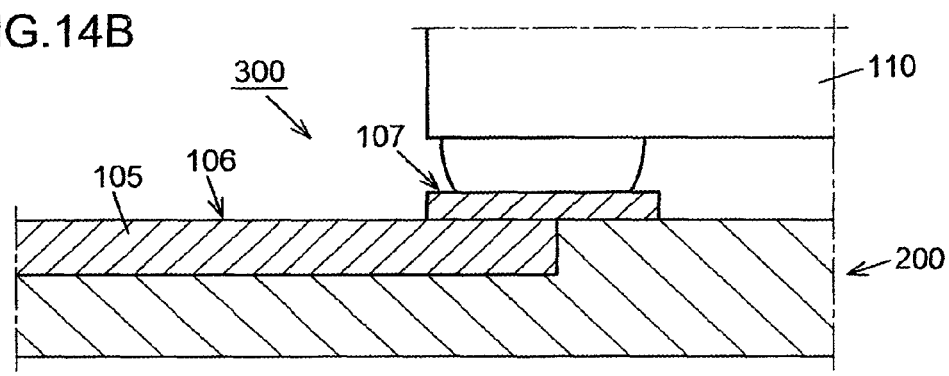
FIG. 14B is an enlarged cross section showing a favorable example thereof.

Meanwhile, as shown in FIG. 14, the pad part 107 may be mounted subsequently on the surface of the three-dimensional structure 200 separately from the wiring 106 after the wiring 106 is formed. However, in the foregoing case, as shown in FIG. 14A, if the entire wiring conductor 105 is embedded in the recessed gutter for wiring 103, since the wiring conductor 105 is not protruding outside the surface of the three-dimensional structure 200, if the end part of the wiring 106 and the end part of the pad part 107 are merely placed together, the wiring conductor 105 and the pad part 107 cannot achieve a favorable contact, and a connection failure will occur. Thus, as shown in FIG. 14B, if the entire wiring conductor 105 is embedded in the recessed gutter for wiring 103, it is important to place the pad part 107 on the end part of the wiring 106 by being overlapped in a predetermined amount so that the wiring conductor 105 and the pad part 107 will contact each other reliably.

With the example illustrated in FIG. 12, the wiring 106 extends across three mutually intersecting adjacent faces 200a, 200b, 200c of the three-dimensional structure 200, but without limitation thereto, it may also extend across two adjacent faces 200a, 200b:200b, 200c or extend across four or more adjacent faces. Moreover, the wiring 106 may pass through a corner part of the mountain line, pass through a corner part of a valley line, or pass through both corner parts. Moreover, the wiring 106 is not limited to a linear shape, and may extend in a curved shape, or be branched as illustrated in FIG. 12. Moreover, for example, the wiring 106 may also extend in the horizontal direction across the vertical side faces configuring the difference in level in FIG. 12.

Fourth Embodiment

Figure 15:
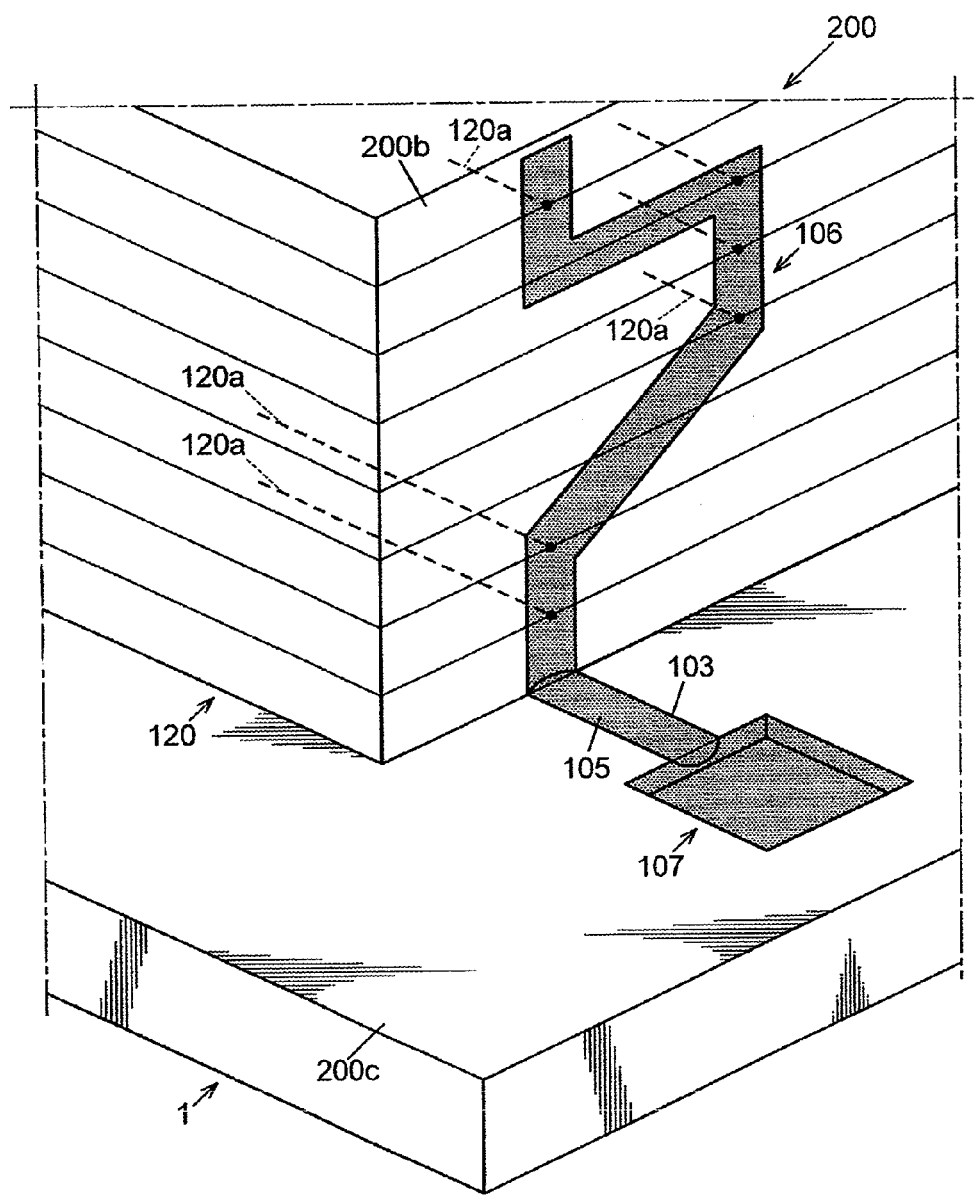
FIG. 15 is an enlarged perspective view showing the relevant part of the three-dimensional structure in which a wiring is provided on its surface according to the fourth embodiment of the present invention.

The same reference numeral is used for members which are the same as or correspond to the members of the third embodiment, and only the characteristic portions of the fourth embodiment are explained. As shown in FIG. 15, while using the configuration of the three-dimensional structure 200 of the third embodiment as the premise, this fourth embodiment relates to a three-dimensional structure 200 including a multilayered circuit board 120, wherein an end part (shown with a black circle in the diagram) of the internal circuits 120a faces a vertical wall 200b of the side face of the multilayered circuit board 120, and a wiring 106 realizes an interlayer connection of the internal circuits 120a of the multilayered circuit board 120 by being connected to the end part of the internal circuits 120a. In this case also, at least a part of the wiring conductor may not be embedded in the recessed gutter for wiring across the entire length of the recessed gutter for wiring, or it may be embedded at one portion, embedded at a plurality of portions, or embedded partially or intermittently in the entire length of the recessed gutter for wiring. Moreover, the recessed gutter for wiring extends across mutually intersecting adjacent faces or on a planar surface or a curved surface (including a bent curved surface, a concave curved surface, a convex curved surface, and a curved surface of the combinations thereof) of the three-dimensional structure.

According to the three-dimensional structure 200 configured as described above, the wiring 106 functions as an external wiring for achieving the interlayer connection. In other words, forming a via hole as a hole for interlayer connection is conventionally known as a technique of interlayer connection in the multilayered circuit board 120. However, since a via hole is disposed on the internal circuit of the multilayered circuit board 120, there was a problem in that the wiring effective area of the internal circuit would decrease by the size of the via holes disposed thereon. The three-dimensional structure 200 of the fourth embodiment can avoid this problem since the embedded-type wiring 106 that passes through the vertical wall 200b of the side face of the multilayered circuit board 120 achieves the interlayer connection of the multilayered circuit board 120. Moreover, the external wiring 106 for achieving the interlayer connection can be easily provided on the vertical wall 200b of the multilayered circuit board 120.

As illustrated in FIG. 15, the wiring 106 that passes through the vertical wall 200b of the side face of the multilayered circuit board 120 may take a detour for connecting to the internal circuit 120a of the respective layers, obliquely pass through the vertical wall 200b, or pass through the vertical wall 200b so that it is not connected to an internal circuit of a predetermined layer.

Fifth Embodiment

Figure 16:
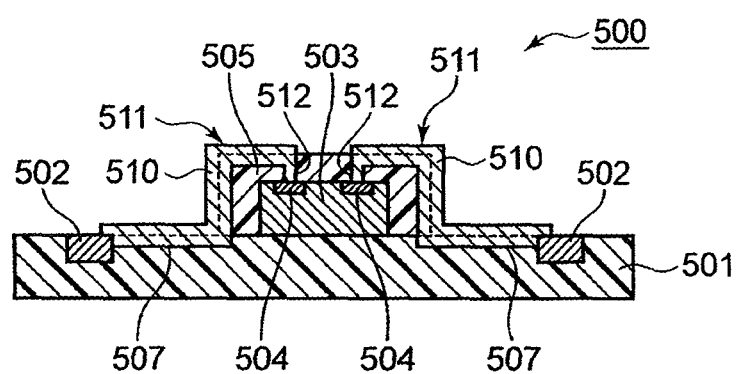
FIG. 16 is a cross section showing the three-dimensional structure in which a wiring is provided on its surface (semiconductor device in which the semiconductor chip mounted on the insulating base material is coated with insulating resin) according to the fifth embodiment of the present invention.

An embodiment of a case where the three-dimensional structure is configured such that the semiconductor chip mounted on the insulating base material is coated with insulating resin (as described above, an insulating organic material such as resin or an insulating organic material such as ceramics as represented by silica (SiO2) may also be used in substitute for the insulating resin) is now explained. Note that the same reference numeral is used for members which are the same as or correspond to the members of the preceding embodiment, and only the characteristic portions of the fifth embodiment are explained. FIG. 16 is a cross section showing a three-dimensional structure 500 according to the fifth embodiment. The three-dimensional structure 500 is a semiconductor device in which a semiconductor chip 503 mounted on an insulating base material 501 is coated with insulating resin 505. A three-dimensional wiring 511 is provided on the surface of the semiconductor device 500. Specifically, the three-dimensional wiring 511 is provided to the surface of the semiconductor device 500 as a result of a recessed gutter for wiring 507 extending between mutually intersecting adjacent faces of the semiconductor device 500 being formed, and at least a part of a wiring conductor 510 being embedded in the recessed gutter for wiring 507. The semiconductor chip 503 may be coated with the insulating resin 505 in its entirety, or may be coated partially only at the portion where the wiring 511 is to be formed. In this case also, at least a part of the wiring conductor may not be embedded in the recessed gutter for wiring across the entire length of the recessed gutter for wiring, or it may be embedded at one portion, embedded at a plurality of portions, or embedded partially or intermittently in the entire length of the recessed gutter for wiring. Moreover, the recessed gutter for wiring extends across mutually intersecting adjacent faces or on a planar surface or a curved surface (including a bent curved surface, a concave curved surface, a convex curved surface, and a curved surface of the combinations thereof) of the three-dimensional structure.

Another end of a connection line 512 in which one end leads to a bonding pad 504 of the semiconductor chip 503 faces the surface of the insulating resin 505, and the wiring 511 connects the other end of the connection line 512 and the electrode pad 502 of the insulating base material 501.

This kind of semiconductor device 500 can be produced, for example, based on the following production method.

Figure 17A:
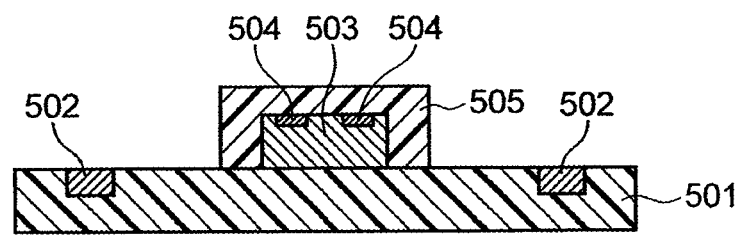
FIG. 17A to FIG. 17C are cross sections explaining the first half of the processes in the method of producing the three-dimensional structure according to the fifth embodiment.

Moreover, as shown in FIG. 17A, the semiconductor chip 503 mounted on the insulating base material 501 is coated with the insulating resin 505 (resin coating step). As the usable insulating resin 505, resin seal materials that have been generally used from the past for sealing the surface of a semiconductor chip in order to protect the semiconductor chip can be used without any particular limitation. Moreover, with respect to the technique of coating the semiconductor chip 503 with the insulating resin 505, resin sealing techniques that have been generally used from the past for sealing the surface of a semiconductor chip in order to protect the semiconductor chip can be used without any particular limitation.

Figure 17B:
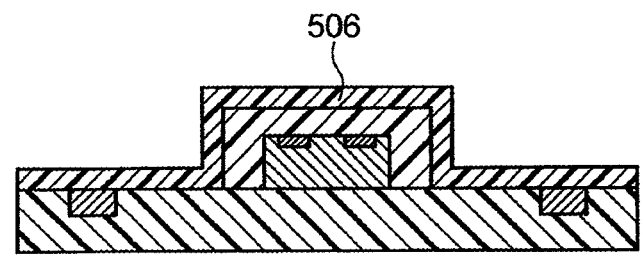

Subsequently, as shown in FIG. 17B, the resin coating 506 is formed on the surface of the insulating resin 505 and the surface of the insulating base material 501 (coating forming step). As the usable resin coating 506, for example, those similar to the resin coating 3 explained in the first embodiment can be used without any particular limitation.

Figure 17C:
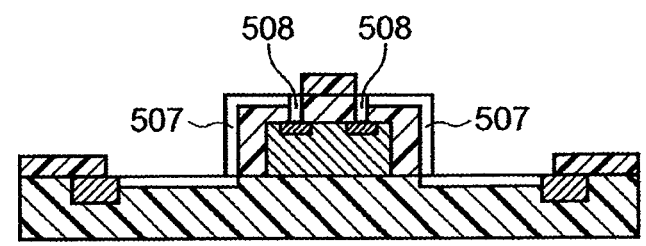

Subsequently, as shown in FIG. 17C, a wiring gutter 507 having a depth that is greater than the thickness of the resin coating 506 and including a communication hole 508 that leads to the bonding pad 504 of the semiconductor chip 503 is formed by performing laser beam machining from an outer surface side of the insulating resin 505 or an outer surface side of the insulating base material 501 (wiring gutter forming step).

Figure 18A:
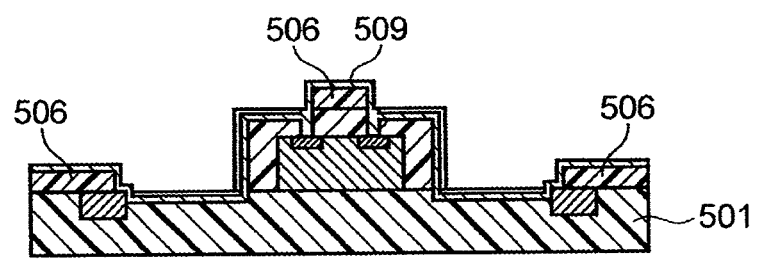
FIG. 18A to FIG. 18C are cross sections explaining the second half of the processes in the method of producing the three-dimensional structure according to the fifth embodiment.

Subsequently, as shown in FIG. 18A, the plating catalyst 509 or its precursor is deposited on the surface of the wiring gutter 507, for example, as with the first embodiment (catalyst depositing step).

Figure 18B:
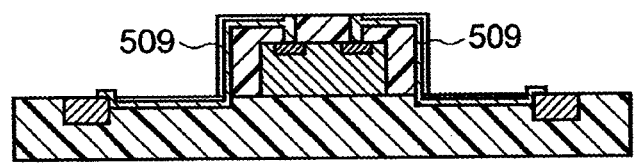

Subsequently, as shown in FIG. 18B, the resin coating 506 is removed by being dissolved or swelled as with the first embodiment (coating removing step).

Figure 18C:
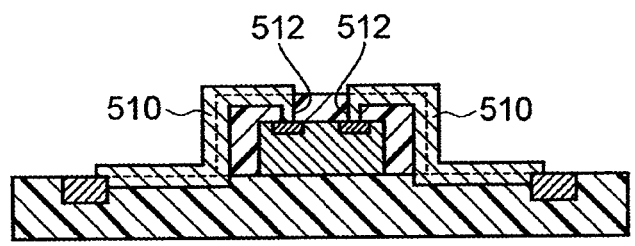

Subsequently, as shown in FIG. 18C, after the resin coating 506 is removed, the electroless plating coating 510 is formed, as with the first embodiment, only at a site where the plating catalyst 509 or a plating catalyst 509 formed from its precursor remains (plating processing step). The electroless plating coating 510 formed inside the communication hole 508 will configure the connection line 512. In substitute for forming the communication hole 508, the connection line 512 made of a conductor extending outward from the bonding pad 504 of the semiconductor chip 503 may also be provided in advance.

As with the fifth embodiment, if the three-dimensional structure 500 is a three-dimensional structure configured such that the semiconductor chip 503 mounted on the insulating base material 501 is coated with the insulating resin 505, since a recessed gutter for wiring 507 is not formed on the surface of the semiconductor chip 503 made of silicon wafer and a recessed gutter for wiring 507 is formed on the surface of the insulating resin 505, there is an advantage in that the recessed gutter for wiring 507 can be formed easily.

Moreover, the wiring 511 is a wiring for electrically connecting the bonding pad 504 of the semiconductor chip 503 to the electrode pad 502 of the insulating base material 501 via the connection line 512.

The foregoing production method was related to the semiconductor chip 503 mounted on the insulating base material 501, but it is not limited thereto, and the production method can similarly applied to a semiconductor chip that is not mounted on an insulating base material, a passive element that is mounted on an insulating base material, or a passive element is not mounted on an insulating base material.

Moreover, although the foregoing production method was related to a case of forming the wiring gutter 507 including the communication hole 508 that leads to the bonding pad 504 of the semiconductor chip 503, it is not limited thereto, and the production method can similarly applied to a wiring gutter which is in communication with another end of a connection line in which one end leads to a bonding pad of the semiconductor chip, a wiring gutter which is in communication with another end of an interconnect line in which one end leads to the semiconductor chip or the passive element, or a wiring gutter including a connection hole leading to the semiconductor chip or the passive element.

Sixth Embodiment

Figure 19A:
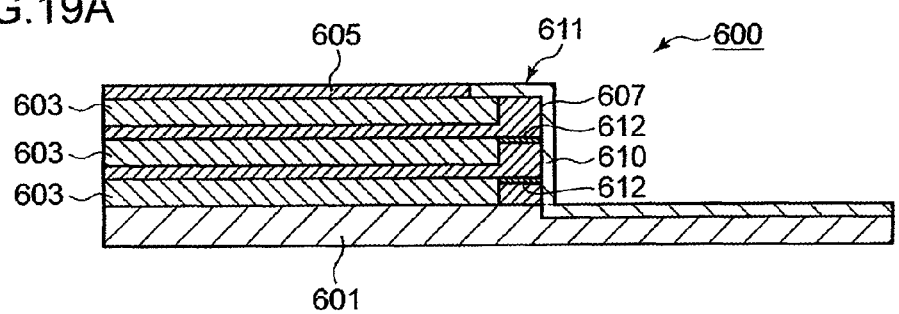
FIG. 19A to FIG. 19C are cross sections showing mutually different examples of the three-dimensional structure in which a wiring is provided on its surface (semiconductor device in which the semiconductor chip mounted on the insulating base material is coated with insulating resin) according to the sixth embodiment of the present invention.
Figure 19B:
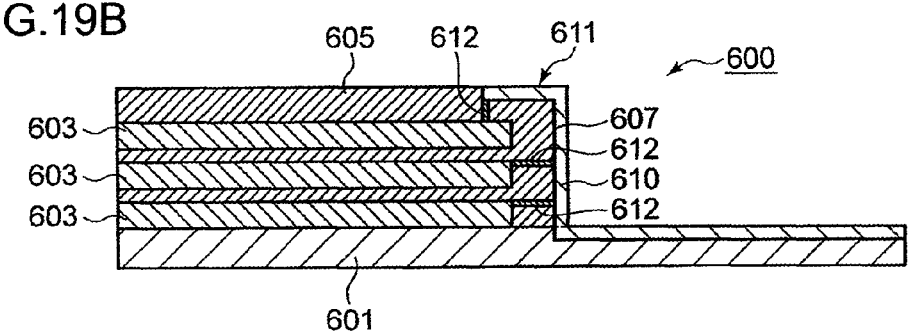
Figure 19C:
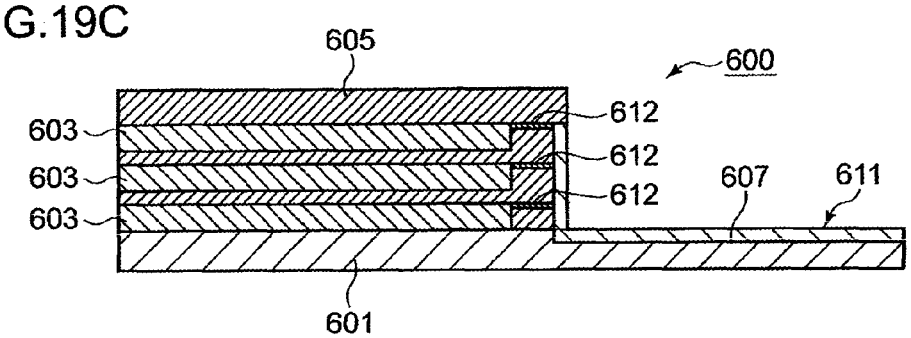

Another embodiment of the three-dimensional structure configured such that a semiconductor chip mounted on an insulating base material is coated with insulating resin (as described above, an insulating organic material such as resin or an insulating organic material such as ceramics as represented by silica ($SiO_2$) may also be used in substitute for the insulating resin) is now explained. Note that the same reference numeral is used for members which are the same as or correspond to the members of the previous embodiments, and only the characteristic portions of the sixth embodiment are explained. FIG. 19A to FIG. 19C are cross sections showing mutually different examples of a three-dimensional structure 600 according to the sixth embodiment. The three-dimensional structure 600 is a semiconductor device in which a plurality of semiconductor chips 603 are mounted on an insulating base material 601 in a state of being stacked in multiple stages, and the semiconductor chip 603 is coated with insulating resin 605. The semiconductor chip 603 may be coated with the insulating resin 605 in its entirety, or may be coated partially only at the portion where the wiring 611 is to be formed. Note that, in this case also, at least a part of the wiring conductor may not be embedded in the recessed gutter for wiring across the entire length of the recessed gutter for wiring, or it may be embedded at one portion, embedded at a plurality of portions, or embedded partially or intermittently in the entire length of the recessed gutter for wiring. Moreover, the recessed gutter for wiring extends across mutually intersecting adjacent faces or on a planar surface or a curved surface (including a bent curved surface, a concave curved surface, a convex curved surface, and a curved surface of the combinations thereof) of the three-dimensional structure.

Another end of an interconnect line 612 in which one end leads to the semiconductor chip 603 faces the surface of the insulating resin 605, and the wiring 611 connects a plurality of semiconductor chips 603 by connecting the other ends of the interconnect lines 612.

In the sixth embodiment, the three-dimensional structure 600 is a stacked chip package for achieving the further downsizing and higher densification among the multi chip modules.

Subsequently, an external wiring 611 for connecting the chips is formed on the vertical wall of the side face or the upper surface of the stacked chip package 600.

According to the stacked chip package 600 configured as described above, the wiring 611 will function as an external wiring for connecting the chips as an alternative to the conventional through silicon via technique or the multistage wire bonding technique. In other words, as a technique for connecting semiconductor chips in a stacked chip package 600 in which a plurality of semiconductor chips 603 are stacked in multiple stages, conventionally known are the through silicon via technique and the multistage wire bonding technique. However, with through silicon via, since via is disposed on the circuit of a semiconductor chip 603, there was a problem in that the wiring effective area of the circuit in the chip 603 would decrease by the size of the disposed via. Moreover, with multistage wire bonding, in addition to the lack of reliability as described in the background art, there are problems in that the mounting area is large and that high densification cannot be achieved. The stacked chip package 600 of the sixth embodiment forms an embedded-type external wiring 611 for connecting the chips on the vertical wall of the side face or the upper surface of the stacked chip package 600, and the external wiring 611 connects the plurality of chips built into the stacked chip package 600 via the interconnect line 612. Thus, the foregoing problems can be avoided.

FIG. 19A shows a stacked chip package 600 where the thickness of the insulating resin 605 of the upper most part of the stacked chip package 600 is thin, and the external wiring 611 of the upper surface of the stacked chip package 600 is directly connected to the chip 603 of the uppermost layer.

Moreover, FIG. 19B shows a case of forming a vertical hole-type connection hole leading to the chip 603 of the upper most layer on the external wiring 611 of the upper surface of the stacked chip package 600 since the thickness of the insulating resin 605 of the uppermost part of the stacked chip package 600 is thick, and the electroless plating coating formed inside the connection hole (vertical hole) configuring the interconnect line 612. In substitute for forming the connection hole (vertical hole), an interconnect line 612 made of a conductor that extends from the semiconductor chip 603 toward the outside (vertically) may be provided in advance.

Moreover, FIG. 19C shows a case of forming a horizontal hole-type connection hole leading to the chip 603 of the upper most layer on the external wiring 611 of the vertical wall of the side face of the stacked chip package 600 since the thickness of the insulating resin 605 of the uppermost part of the stacked chip package 600 is thick, and the electroless plating coating formed inside the connection hole (horizontal hole) configuring the interconnect line 612. In substitute for forming the connection hole (horizontal hole), an interconnect line 612 made of a conductor that extends from the semiconductor chip 603 toward the outside (horizontally) may be provided in advance.

In FIG. 19A to FIG. 19C, reference numeral 607 shows a recessed gutter for wiring and reference numeral 610 shows a wiring conductor.

Seventh Embodiment

Figure 20:
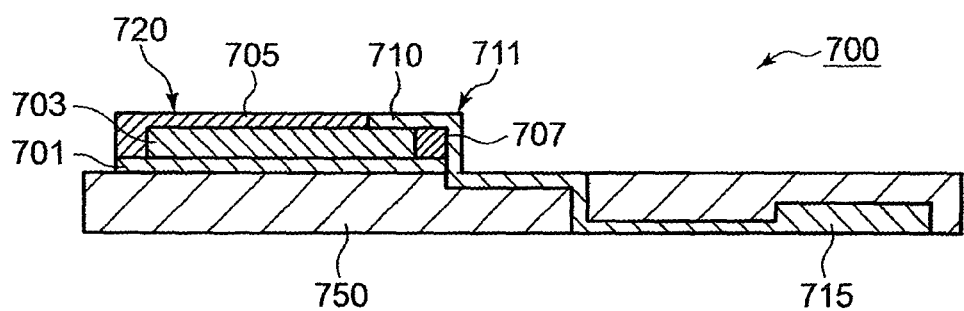
FIG. 20 is a cross section of a memory card as a specific example of the three-dimensional structure in which a wiring is provided on its surface (semiconductor device in which the semiconductor chip mounted on the insulating base material is coated with insulating resin) according to the seventh embodiment of the present invention.

Subsequently, a separate embodiment of the three-dimensional structure configured such that a semiconductor chip mounted on an insulating base material is coated with insulating resin (as described above, an insulating organic material such as resin or an insulating organic material such as ceramics as represented by silica ($SiO_2$) may also be used in substitute for the insulating resin) is now explained. The same reference numeral is used for members which are the same as or correspond to the members of the previous embodiments, and only the characteristic portions of the seventh embodiment are explained. FIG. 20 is a cross section showing the three-dimensional structure 700 according to the seventh embodiment. The three-dimensional structure 700 is a memory card in which a memory package 720 is mounted on a support medium 750. The memory package 720 is configured such that a semiconductor chip 703 is mounted on an insulating base material 701, and the semiconductor chip 703 is coated with insulating resin 705. The semiconductor chip 703 may be coated with the insulating resin 705 in its entirety, or may be coated partially only at the portion where the wiring 711 is to be formed. In this case also, at least a part of the wiring conductor may not be embedded in the recessed gutter for wiring across the entire length of the recessed gutter for wiring, or it may be embedded at one portion, embedded at a plurality of portions, or embedded partially or intermittently in the entire length of the recessed gutter for wiring. Moreover, the recessed gutter for wiring extends across mutually intersecting adjacent faces or on a planar surface or a curved surface (including a bent curved surface, a concave curved surface, a convex curved surface, and a curved surface of the combinations thereof) of the three-dimensional structure.

In the memory card 700, formed on the surface of the memory package 720 and the surface of the support medium 750 is a three-dimensional wiring 711 in which at least a part of the wiring conductor 710 is embedded in the recessed gutter for wiring 707. In other words, a recessed gutter for wiring 707 extending between the mutually intersecting adjacent faces of the memory card 700 is formed on the surface of the memory card 700, and at least a part of the wiring conductor 710 is embedded in the recessed gutter for wiring 707. In FIG. 20, reference numeral 715 shows a pad part for electrically connecting to an external device.

With the memory card 700 configured as described above, a card case is no longer required, and the further downsizing of the memory card as a product can be achieved.

Eighth Embodiment

Figure 21:
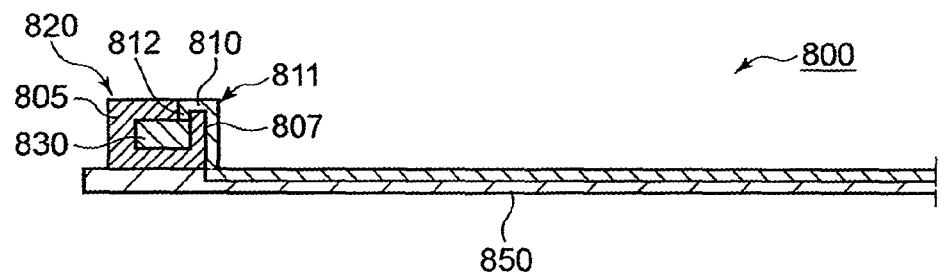
FIG. 21 is a cross section showing the magnetic head as a specific example of the three-dimensional structure in which a wiring is provided on its surface (electrical device in which the passive element is coated with insulating resin) according to the eighth embodiment of the present invention.

An embodiment of a case where three-dimensional structure is configured such that the passive element is coated with an insulating resin (as described above, an insulating organic material such as resin or an insulating organic material such as ceramics as represented-by silica ($SiO_2$) may also be used in substitute for the insulating resin) is now explained. Note that the same reference numeral is used for members which are the same as or correspond to the members of the previous embodiments, and only the characteristic portions of the eighth embodiment are explained. FIG. 21 is a cross section showing a three-dimensional structure 800 according to the eighth embodiment. The three-dimensional structure 800 is a magnetic head module in which a magnetic head 820 is mounted on a harness 850. The magnetic head 820 is an electrical device configured such that a magnetic sensor 830 as a passive element is coated with insulating resin 805. The magnetic sensor 830 may be coated with the insulating resin 805 in its entirety, or may be coated partially only at the portion where the wiring 811 is to be formed. In this case also, at least a part of the wiring conductor may not be embedded in the recessed gutter for wiring across the entire length of the recessed gutter for wiring, or it may be embedded at one portion, embedded at a plurality of portions, or embedded partially or intermittently in the entire length of the recessed gutter for wiring. Moreover, the recessed gutter for wiring extends across mutually intersecting adjacent faces or on a planar surface or a curved surface (including a bent curved surface, a concave curved surface, a convex curved surface, and a curved surface of the combinations thereof) of the three-dimensional structure.

In the magnetic head module 800, formed on the surface of the magnetic head 820 and the surface of the harness 850 is a three-dimensional wiring 811 in which at least a part of the wiring conductor 810 is embedded in the recessed gutter for wiring 807. In other words, a recessed gutter for wiring 807 extending between the mutually intersecting adjacent faces of the magnetic head module 800 is formed on the surface of the magnetic head module 800, and at least a part of the wiring conductor 810 is embedded in the recessed gutter for wiring 807.

In the magnetic head module 800, another end of an interconnect line 812 in which one end leads to the magnetic sensor 830 faces the surface of the insulating resin 805, and the wiring 811 is connected to the other end of the interconnect line 812. Accordingly, the wiring 811 becomes a wiring that is electrically connected to the magnetic sensor 830 as a passive element via the interconnect line 812.

Since a recessed gutter for wiring 807 is not formed on the surface of the magnetic sensor 830 as a passive element and a recessed gutter for wiring 807 is formed on the surface of the insulating resin 805, there is an advantage in that the recessed gutter for wiring 807 can be formed easily.

In the magnetic head module 800, since the electrical device is a magnetic head 820, on the surface of the magnetic head 820, formed is the three-dimensional wiring 811 in which at least a part of the wiring conductor 810 is embedded in the recessed gutter for wiring 807.

Moreover, when viewing the entire magnetic head module 800 in which the magnetic head 820 is mounted on the harness 850, on the surface of the magnetic head module 800, formed is the three-dimensional wiring 811 in which at least a part of the wiring conductor 810 is embedded in the recessed gutter for wiring 807.

In the eighth embodiment, although a case was explained where the magnetic sensor 830 as a passive element is coated with the insulating resin 805 in a state of not being mounted on the insulating base material, the configuration is not limited thereto, and the magnetic sensor 830 may also be coated with the insulating resin 805 in a state of being mounted on the insulating base material.

Embodiments of the present invention were described in detail above, but the foregoing explanations are merely an illustration in all aspects, and the present invention is not limited thereto. It should be understood that numerous modified examples that are not illustrated can be envisioned without deviating from the scope of the present invention.

As described above, the present specification disclosed various embodiments of the present invention. The main modes among the foregoing embodiments are summarized below.

One aspect of the present invention is a method of mounting a semiconductor chip for electrically connecting a bonding pad, which is provided on a surface of a semiconductor chip disposed on an insulating base material surface, to an electrode pad corresponding to the bonding pad formed on the insulating base material surface, the method having: a coating forming step of forming a resin coating on a surface of a path connecting the bonding pad and the electrode pad; a wiring gutter forming step of forming, by laser beam machining, a wiring gutter having a depth that is equal to or greater than a thickness of the resin coating along the path for connecting the bonding pad and the electrode pad; a catalyst depositing step of depositing a plating catalyst or a precursor thereof a surface of the wiring gutter; a coating removing step of removing the resin coating by causing this coating to dissolve or swell in a predetermined liquid; and a plating processing step of forming, after the resin coating is removed, an electroless plating coating only at a site where the plating catalyst or a plating catalyst formed from the plating catalyst precursor remains.

According to this method of mounting a semiconductor chip, the wiring for connecting the semiconductor chip disposed on the insulating base material surface and the electrode of the insulating base material surface can be formed on the insulating base material surface and the semiconductor chip surface in a manner of being formed along the wall of the semiconductor chip and the insulating base material surface. Since the wiring formed as described above is formed on the surface of the insulating base material or the semiconductor chip, it will be stronger in comparison to the wiring formed with wire bonding. Moreover, the wiring will not be damaged due to resin pressure even during the resin sealing. Moreover, accurate wiring can be formed with a simple process by using laser beam machining.

Preferably, the foregoing method of mounting a semiconductor chip further comprises an electrolytic plating step of using the formed electroless plating coating as an electrode and performing electrolytic plating in order to thicken a circuit. Although it is relatively time-consuming since the thickening is achieved only with electroless plating, according to the electrolytic plating step, since a wiring of a thin film can be formed by performing electroless plating for a short period of time and the formed electroless plating coating can thereafter be used as the feed electrode, thickening can be achieved in a short period of time.

In the foregoing method of mounting a semiconductor chip, preferably, the resin coating contains a fluorescent substance, and the method further comprises an inspecting step of inspecting a coating removal failure by using emission of light from the fluorescent substance after the coating removing step and before the plating processing step. According to this inspecting step, since the coating removal failure can be confirmed, it is possible to inhibit the formation of the plating film at unwanted portions.

In the foregoing method of mounting a semiconductor chip, preferably, the resin coating is made of swellable resin that is peeled as a result of being swelled in a predetermined liquid from the perspective of facilitating removal.

In the foregoing method of mounting a semiconductor chip, preferably, the thickness of the resin coating is 10 μm or less. If the thickness is too thick, the dimension accuracy tends to deteriorate upon partially removing the resin coating with laser beam machining, and, if the thickness is too thin, the formation of a coating with a uniform film thickness tends to become difficult.

In the foregoing method of mounting a semiconductor chip, preferably, the resin coating is a coating that is formed by applying and subsequently drying a suspension or an emulsion of an elastomer on the insulating base material surface.

In the foregoing method of mounting a semiconductor chip, preferably, the resin coating is formed by transferring the swellable resin coating formed on the support base material to the insulating base material surface.

Another aspect of the present invention is a semiconductor device, wherein a semiconductor chip including a bonding pad is disposed on an insulating base material surface, and the bonding pad is connected to an electrode pad formed on the insulating base material surface via a plating film formed on a surface of the semiconductor chip and on the insulating base material surface.

Yet another aspect of the present invention is a method of connecting semiconductor chips for mutually and electrically connecting bonding pats provided to a plurality of semiconductor chips disposed on an insulating base material surface, the method having: a coating forming step of forming a resin coating on a surface of a path connecting a bonding pad formed on a first semiconductor chip and a bonding pad formed on a second semiconductor chip; a wiring gutter forming step of forming, by laser beam machining, a wiring gutter having a depth that is equal to or greater than a thickness of the resin coating along the path; a catalyst depositing step of depositing a plating catalyst or a precursor thereof on a surface of the wiring gutter; a coating removing step of removing the resin coating by causing this coating to dissolve or swell in a predetermined liquid; and a plating processing step of forming, after the resin coating is removed, an electroless plating coating only at a site where the plating catalyst or a plating catalyst formed from the plating catalyst precursor remains. According to this method of connecting semiconductor chips, since the wiring can be formed to go over the difference in level caused by the semiconductor chip, a plurality of semiconductor chips can be electrically connected on a substrate with a simple method. Accordingly, the production of a multi chip module and the like can be realized easily.

Yet another aspect of the present invention is a three-dimensional structure in which a wiring is formed on a surface, wherein, on the surface of the three-dimensional structure, a recessed gutter for wiring is formed, extending between mutually intersecting adjacent faces or on a planar surface or a curved surface of the three-dimensional structure, and wherein at least a part of a wiring conductor is embedded in the recessed gutter for wiring. According to this three-dimensional structure, since at least a part of the wiring conductor is embedded in the recessed gutter for wiring extending between mutually intersecting adjacent faces of the three-dimensional structure, even if the line width of the wiring is thin and narrow, the adhesive strength of the wiring relative to the three-dimensional structure is improved. Consequently, even if the wiring passes through the corner part of a mountain line protruding outward of the three-dimensional structure, problems such as the falling and dislocation of the wiring can be reduced. Moreover, since at least a part of the plated metal is embedded in the recessed gutter for wiring, problems such as the wiring being disconnected due to physical external force can also be reduced.

The wiring is a three-dimensional wiring that is provided on the surface of a three-dimensional structure, and the wiring is formed so as to creep along the surface of the three-dimensional structure while being in contact with such surface. Accordingly, there is no need to give consideration to the phenomena such as a wire sweep in the wire bonding, and extremely high wiring density can be achieved. Moreover, only a part of the wiring conductor needs to be embedded in the recessed gutter for wiring, and the other portions of the wiring conductor may be outside the surface of the three-dimensional structure. Needless to say, if the entire wiring conductor is embedded in the recessed gutter for wiring, the wiring will not be easily affected from the outside, and problems such as the falling, dislocation and disconnection of the wiring can be inhibited more effectively. In the foregoing case, the surface of the wiring conductor may be flush with the surface of the three-dimensional structure, or may be retreated more inward of the recessed gutter for wiring than the surface of the three-dimensional structure.

In the three-dimensional structure, if a pad part is provided on the surface of the three-dimensional structure, and the wiring is connected to the pad part, the wiring will be connected to the internal circuit of the three-dimensional structure that is in conduction with the pad part, or a component or the like mounted on the pad part.

In the three-dimensional structure, if the three-dimensional structure includes a multilayered circuit board, an end part of an internal circuit faces a vertical wall of a side face of the multilayered circuit board, and the wiring forms an interlayer connection of internal circuits of the multilayered circuit board by being connected to the end part of the internal circuits, the wiring will function as an external wiring for interlayer connection as a substitute for the technique of forming a via hole as the hole for conventional interlayer connection. Consequently, with the conventional technique of forming a via hole, there was a problem in that the wiring effective area of the internal circuit would decrease by the size of the via holes disposed on the internal circuit of the multilayered circuit board, but such a problem can be resolved. Moreover, the external wiring for interlayer connection can be easily formed on the vertical wall of the multilayered circuit board.

In the three-dimensional structure, if the three-dimensional structure is a semiconductor device in which a semiconductor chip is mounted on an insulating base material, a three-dimensional wiring in which at least a part of the wiring conductor is embedded in the recessed gutter for wiring will be formed on the surface of the insulating base material or the surface of the semiconductor chip. The wiring of the foregoing case becomes, as described above, a wiring for electrically connecting the bonding pad provided to the surface of a semiconductor chip disposed on the insulating base material surface to the electrode pad formed on the insulating base material surface.

As other specific examples of the three-dimensional structure, there are, for example, a stacked chip package in which a plurality of semiconductor chips are mounted in a state of being stacked in multiple stages on a three-dimensionally formed circuit board, multilayered circuit board, or insulating base material, a semiconductor device configured such that a semiconductor device (for instance, a memory package or the like) that is mounted on an insulating base material or a semiconductor chip that is not mounted on an insulating base material is coated with insulating resin, a memory card in which the memory package is mounted on a support medium, an electrical device (for instance, a magnetic head or the like) configured such that a passive element (for instance, a resistor, a capacitor, a coil, various sensors or the like) that is mounted on an insulating base material or a passive element that is not mounted on an insulating base material is coated with insulating resin, and a magnetic head module or the like in which the magnetic head is mounted on a harness.

A semiconductor device in which a semiconductor chip is mounted, via the pad part, on the three-dimensional structure is a semiconductor device in which a semiconductor chip is mounted on the three-dimensional structure wherewith a three-dimensional wiring, in which at least a part of the wiring conductor is embedded in the recessed gutter for wiring, is formed on its surface.

In the three-dimensional structure, if the three-dimensional structure is a semiconductor device in which a semiconductor chip is mounted on an insulating base material and the semiconductor chip is coated with insulating resin, a three-dimensional wiring in which at least a part of the wiring conductor is embedded in the recessed gutter for wiring will be formed on the surface of the insulating base material or the surface of the insulating resin coating the semiconductor chip. Since a recessed gutter for wiring is not formed on the surface of the semiconductor chip made of silicon wafer and a recessed gutter for wiring is formed on the surface of the insulating resin, there is an advantage in that the recessed gutter for wiring can be formed easily.

In the three-dimensional structure, if the three-dimensional structure is a semiconductor device in which a plurality of semiconductor chips are stacked in multiple stages on an insulating base material, and the semiconductor chips are coated with insulating resin, a three-dimensional wiring, in which at least a part of the wiring conductor is embedded in the recessed gutter for wiring, will be formed on the surface of the stacked chip package in which further downsizing and higher densification can be sought among the multi chip modules.

In the three-dimensional structure, if one end of a connection line in which the other end leads to a bonding pad of the semiconductor chip faces the surface of the insulating resin, and the wiring connects the one end of the connection line and the electrode pad of the insulating base material, the wiring becomes a wiring for electrically connecting the bonding pad of the semiconductor chip to the electrode pad of the insulating base material via the connection line.

In the three-dimensional structure, if one end of an interconnect line in which the other end leads to the semiconductor chip faces the surface of the insulating resin, and the wiring connects the plurality of semiconductor chips by connecting each interconnect line on the one end, the wiring will function as an external wiring for connecting the semiconductor chips as an alternative to the conventional through silicon via technique or the multistage wire bonding technique. In other words, as a technique for connecting semiconductor chips in a stacked chip package in which a plurality of semiconductor chips are stacked in multiple stages, conventionally known are the through silicon via technique and the multistage wire bonding technique. However, with through silicon via, since via is disposed on the circuit of a semiconductor chip, there was a problem in that the wiring effective area of the circuit in the chip would decrease by the size of the disposed via. Moreover, with multistage wire bonding, in addition to the lack of reliability as described in the background art, there are problems in that the mounting area is large and that high densification cannot be achieved. In light of the foregoing problems, the three-dimensional structure of the present configuration forms an embedded-type external wiring for connecting the chips on the vertical wall of the side face or the upper surface of the stacked chip package, and the external wiring connects the chips built into the three-dimensional structure via the interconnect line. Thus, the foregoing problems can be avoided.

In the three-dimensional structure, if the semiconductor device is a memory package, a three-dimensional wiring, in which at least a part of the wiring conductor is embedded in the recessed gutter for wiring, will be formed on the surface of the memory package.

Yet another aspect of the present invention is a memory card in which the memory package is mounted on a support medium, wherein, on a surface of the memory card, a recessed gutter for wiring is formed between mutually intersecting adjacent faces or on a planar surface or a curved surface of the memory card, and wherein at least a part of a wiring conductor is embedded in the recessed gutter for wiring. According to the foregoing configuration, formed on the surface of the memory card is a three-dimensional wiring in which at least a part of the wiring conductor is embedded in the recessed gutter for wiring.

In the three-dimensional structure, if the three-dimensional structure is an electrical device in which a passive element is coated with insulating resin, a three-dimensional wiring, in which at least a part of the wiring conductor is embedded in the recessed gutter for wiring, will be formed on the surface of the electrical device. Since a recessed gutter for wiring is not formed on the surface of the passive element and a recessed gutter for wiring is formed on the surface of the insulating resin, there is an advantage in that the recessed gutter for wiring can be formed easily.

In the three-dimensional structure, if one end of an interconnect line in which the other end leads to the passive element faces the surface of the insulating resin, and the wiring is connected to the one end of the interconnect line, the wiring becomes a wiring that is electrically connected to the passive element via the interconnect line.

In the three-dimensional structure, if the electrical device is a magnetic head, a three-dimensional wiring, in which at least a part of the wiring conductor is embedded in the recessed gutter for wiring, will be formed on the surface of the magnetic head.

Yet another aspect of the present invention is a magnetic head module in which the magnetic head is mounted on a harness, wherein, on a surface of the magnetic head module, a recessed gutter for wiring is formed between mutually intersecting adjacent faces or a planar surface or a curved surface of the magnetic head module, and wherein at least a part of a wiring conductor is embedded in the recessed gutter for wiring. According to the foregoing configuration, formed on the surface of the magnetic head module is a three-dimensional wiring in which at least a part of the wiring conductor is embedded in the recessed gutter for wiring.

Yet another aspect of the present invention is a method of producing a three-dimensional structure in which a wiring is formed on a surface, the method having: a resin coating step of coating, with insulating resin, a semiconductor chip mounted or not mounted on an insulating base material or a passive element; a coating forming step of forming a resin coating on a surface of the insulating resin or on a surface of the insulating base material; a wiring gutter forming step of forming, by performing laser beam machining from an outer surface side of the insulating resin or an outer surface side of the insulating base material, a wiring gutter which has a depth that is greater than a thickness of the resin coating and which is in communication with one end of a connection line in which the other end leads to a bonding pad of the semiconductor chip, a wiring gutter which is in communication with one end of an interconnect line in which the other end leads to the semiconductor chip or the passive element, a wiring gutter including a communication hole leading to the bonding pad of the semiconductor chip, or a wiring gutter including a connection hole leading to the semiconductor chip or the passive element; a catalyst depositing step of depositing a plating catalyst or a precursor thereof on a surface of the wiring gutter; a coating removing step of removing the resin coating by causing the coating to dissolve or swell in a predetermined liquid; and a plating processing step of forming, after the resin coating is removed, an electroless plating coating only at a site where the plating catalyst or a plating catalyst precursor formed from the plating catalyst precursor remains. According to this method of producing a three-dimensional structure, since a recessed gutter for wiring is not formed on the surface of a semiconductor chip made of silicon wafer or the surface of the passive element and a recessed gutter for wiring is formed on the surface of the insulating resin, there is an advantage in that the recessed gutter for wiring can be formed easily.

INDUSTRIAL APPLICABILITY

According to the present invention, a wiring for connecting the semiconductor chip disposed on the insulating base material surface and the electrode of the insulating base material surface or a plurality of semiconductor chips disposed on the insulating base material surface can be formed on the insulating base material surface and the semiconductor chip surface in a manner of creeping along the wall of the semiconductor chip and the insulating base material surface. The wiring formed as described above will be stronger in comparison to the wiring formed with wire bonding. Accordingly, the wiring will not be damaged due to resin pressure even during the resin sealing. Moreover, according to the present invention, since the adhesive strength of the wiring relative to the three-dimensional structure is improved in the three-dimensional structure such as a semiconductor device in which a wiring is provided on its surface, problems such as the falling, dislocation and cut of the wiring can be reduced. Accordingly, the present invention can be broadly applied industrially in the technical field of mounting methods of semiconductor chips and three-dimensional structures in which a wiring is provided on its surface.

What is claimed is:

1. A three-dimensional structure in which a wiring and a pad part are provided on a surface, wherein
   a recessed gutter for wiring and a hole for the pad part having a depth that is greater than a thickness of the recessed gutter for wiring are provided on the surface of the three-dimensional structure,
   the hole for the pad part is provided in succession with the recessed gutter for wiring, and
   at least a part of a wiring conductor is embedded in the recessed gutter for wiring and in the hole for the pad part.

2. A three-dimensional structure in which a wiring and a pad part are provided on a surface, wherein
   a recessed gutter for wiring and a hole for the pad part are provided on the surface of the three-dimensional structure,
   at least a part of a wiring conductor is embedded in the recessed gutter for wiring and in the hole for the pad part, and
   a thickness of the wiring conductor embedded in the recessed gutter for wiring is different, at least partially, from a thickness of the wiring conductor embedded in the hole for the pad part.

3. The three-dimensional structure according to claim 2, wherein the thickness of the wiring conductor embedded in the hole for the pad part is greater, at least partially, than the thickness of the wiring conductor embedded in the recessed gutter for wiring.

4. A three-dimensional structure in which a wiring and a pad part are provided on a surface, wherein
   a recessed gutter for wiring is provided on the surface of the three-dimensional structure, at least a part of a wiring conductor is embedded in the recessed gutter for wiring, and at least a part of the pad part is provided on the wiring conductor.

* * * * *